(12) United States Patent
Kamioka et al.

(10) Patent No.: US 8,115,249 B2
(45) Date of Patent: Feb. 14, 2012

(54) NONVOLATILE SEMICONDUCTOR MEMORY DEVICE AND METHOD FOR MANUFACTURING THE SAME

(75) Inventors: Isao Kamioka, Tokyo (JP); Yoshio Ozawa, Kanagawa-ken (JP); Katsuyuki Sekine, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 12/563,651

(22) Filed: Sep. 21, 2009

(65) Prior Publication Data
US 2010/0140682 A1  Jun. 10, 2010

(30) Foreign Application Priority Data

Dec. 10, 2008 (JP) .................................. 2008-314184

(51) Int. Cl.
*H01L 29/88* (2006.01)
(52) U.S. Cl. ........ 257/324; 257/319; 257/320; 257/321; 257/322; 257/323; 257/325; 257/326; 257/E29.003
(58) Field of Classification Search .......... 257/319–326, 257/E29.003
See application file for complete search history.

(56) References Cited

U.S. PATENT DOCUMENTS

| 2008/0121972 A1* | 5/2008 | Shiozawa et al. ............. 257/316 |
| 2008/0173930 A1 | 7/2008 | Watanabe et al. |
| 2008/0197403 A1* | 8/2008 | Ozawa et al. ................. 257/321 |
| 2009/0246932 A1 | 10/2009 | Kamioka et al. |

FOREIGN PATENT DOCUMENTS

JP  2008-182035  8/2008

OTHER PUBLICATIONS

U.S. Appl. No. 13/008,469, filed Jan. 18, 2011, Sekine et al.
U.S. Appl. No. 12/405,474, filed Mar. 17, 2009, Yoshio Ozawa et al.

* cited by examiner

*Primary Examiner* — Cuong Q Nguyen
*Assistant Examiner* — Tran Tran
(74) *Attorney, Agent, or Firm* — Oblon, Spivak, McClelland, Maier & Neustadt, L.L.P.

(57) ABSTRACT

In a nonvolatile semiconductor memory device, a tunnel insulating layer, a charge storage layer and a charge block layer are formed on a silicon substrate in this order, and a plurality of control gate electrodes are provided above the charge block layer. Moreover, a cap layer made of silicon nitride is formed between the charge block layer and each of the control gate electrode, the cap layer being divided for each gate control electrode.

13 Claims, 32 Drawing Sheets

US 8,115,249 B2

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2008-314184, filed on Dec. 10, 2008; the entire contents of which are incorporated herein by reference.

BACKGROUND OF THE INVENTION

1. Field of the Invention

This invention relates to a charge trap type nonvolatile semiconductor memory device and a method for manufacturing the same.

2. Background Art

Conventionally, a memory device including MONOS (metal-oxide-nitride-oxide-silicon) type memory cells has been developed as a nonvolatile semiconductor memory device. In a MONOS type memory cell, a control gate electrode made of a metal or the like, a charge block layer made of silicon oxide or the like, a charge storage layer made of silicon nitride, a tunnel insulating layer made of silicon oxide or the like, and a channel member made of silicon are arranged in this order (see, e.g., JP-A-2008-182035 (Kokai)). Thus, charge is supplied from the channel member through the tunnel insulating layer to the charge storage layer and stored therein to store information (data).

However, such a MONOS type memory cell has the problem of narrow memory window, that is, the variable range of the threshold voltage of the memory cell varied in response to data rewriting is narrow. This interferes with the speedup of rewriting operation and increase in memory capacity. Another problem is that data retention characteristics and data program/erase characteristics vary between memory cells. In particular, with the downscaling of memory cells, this variation in characteristics becomes unacceptable and causes malfunctions of memory cells.

SUMMARY OF THE INVENTION

According to an aspect of the invention, there is provided a nonvolatile semiconductor memory device including: a semiconductor member; a tunnel insulating layer provided on a surface of the semiconductor member; a charge storage layer provided on the tunnel insulating layer; a charge block layer provided on the charge storage layer; a plurality of control gate electrodes provided above the charge block layer and arranged so as to be spaced from each other; and a cap layer provided between the charge block layer and each of the control gate electrodes and made of silicon nitride, the cap layer being divided for each of the control gate electrodes.

According to another aspect of the invention, there is provided a nonvolatile semiconductor memory device including: a semiconductor member; a tunnel insulating layer provided on a surface of the semiconductor member; a charge storage layer provided on the tunnel insulating layer; and a plurality of control gate electrodes provided on the charge storage layer and arranged so as to be spaced from each other, the charge storage layer being divided for each of the control gate electrodes.

According to still another aspect of the invention, there is provided a method for manufacturing a nonvolatile semiconductor memory device, including: forming a multilayer structure body by alternately forming conductive films primarily composed of silicon and interlayer insulating films primarily composed of silicon oxide; forming a trench in the multilayer structure body to expose the conductive films and the interlayer insulating films to an inner surface of the trench; forming a cap layer made of silicon nitride by exposing the inner surface of the trench to a plasma atmosphere containing nitrogen radicals to selectively nitridize an exposed surface of the conductive films; forming a charge block layer on the inner surface of the trench; forming a charge storage layer on the charge block layer; forming a tunnel insulating layer on the charge storage layer; and forming a semiconductor member on the tunnel insulating layer.

BRIEF DESCRIPTION OF THE DRAWINGS

FIGS. 2A and 2B to 7A and 7B are process cross-sectional views illustrating a method for manufacturing the nonvolatile semiconductor memory device according to the first embodiment, where the figures with the suffix A show a cross section in the word line direction (channel width direction), and the figures with the suffix B show a cross section in the bit line direction (channel length direction);

FIGS. 15A and 15B to 18A and 18B are process views illustrating the method for manufacturing a nonvolatile semiconductor memory device according to the third embodiment, where the figures with the suffix A show a cross section in the channel length direction, and the figures with the suffix B show a plan view;

FIGS. 23A and 23B to 26A and 26B are process views illustrating a method for manufacturing the nonvolatile semiconductor memory device according to the fourth embodiment, where the figures with the suffix A show a cross section in the channel length direction, and the figures with the suffix B show a plan view;

FIGS. 32A and 32B to 35A and 35B are process views illustrating a method for manufacturing the nonvolatile semiconductor memory device according to the sixth embodiment, where the figures with the suffix A show a cross section in the channel length direction, and the figures with the suffix B show a plan view.

DETAILED DESCRIPTION OF THE INVENTION

Embodiments of the invention will now be described with reference to the drawings.

At the outset, a first embodiment of the invention is described.

Figure 1:
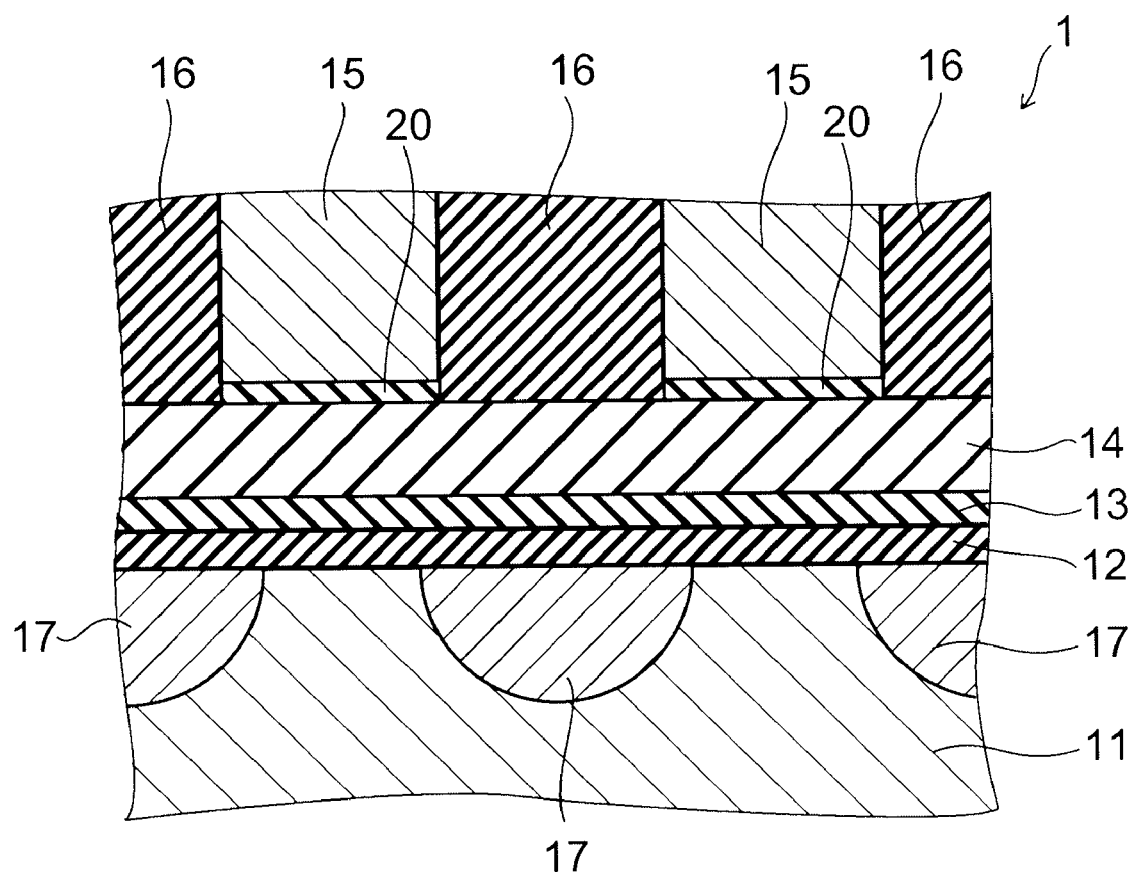
FIG. 1 is a cross-sectional view illustrating a nonvolatile semiconductor memory device according to a first embodiment of the invention.

FIG. 1 is a cross-sectional view illustrating a nonvolatile semiconductor memory device according to this embodiment.

The nonvolatile semiconductor memory device (hereinafter also simply referred to as "device") according to this embodiment is a charge trap type memory device. The charge trap type memory device refers to a memory device in which the threshold voltage variation of the memory cell transistor due to storage/release of charge in the charge trap states is used to store information and read the stored information.

As shown in FIG. 1, the device 1 according to this embodiment includes a NAND type memory cell array in which a plurality of MONOS type memory cells are series connected in the extending direction of bit lines (channel length direction). FIG. 1 shows two memory cells in a cross section parallel to the bit line direction (channel length direction).

The device 1 includes, as a semiconductor member, a silicon substrate 11 illustratively made of single crystal silicon having p-type conductivity. On the silicon substrate 11, from bottom up, a tunnel insulating layer 12 illustratively made of silicon oxide, a charge storage layer 13 illustratively made of silicon nitride and including charge trap states, and a charge block layer 14 made of an insulating material described later are provided.

A plurality of control gate electrodes 15 are provided above the charge block layer 14, and arranged so as to be spaced from each other along the channel length direction. Furthermore, an interelectrode insulating film 16 illustratively made of silicon oxide is buried in the space between the control gate electrodes 15 above the charge block layer 14. Thus, the control gate electrodes 15 are insulated from each other by the interelectrode insulating film 16. Furthermore, an impurity diffusion region 17 having n-type conductivity is formed immediately below the interelectrode insulating film 16 in an upper portion of the silicon substrate 11.

A width of the control gate electrode 15 and a width of the interelectrode insulating film 16 in the channel length direction are each illustratively 100 nm (nanometers) or less, and more specifically 50 nm each. Here, the width of the control gate electrode 15 in the channel length direction corresponds to the width of the memory cell of the device 1. The width of the interelectrode insulating film 16 in the channel length direction corresponds to the width of the memory cell spacing of the device 1. In the following, in this specification, the device with these widths each being 100 nm or less is referred to as a microscale device.

A cap layer 20 made of silicon nitride is formed between the control gate electrode 15 and the charge block layer 14. The cap layer 20 is not provided between the interelectrode insulating film 16 and the charge block layer 14, but divided for each control gate electrode 15. That is, the cap layer 20 formed between one control gate electrode 15 and the charge block layer 14 is separated from the cap layer 20 formed between another control gate electrode 15 located adjacent to this control gate electrode 15 and the charge block layer 14.

For instance, the charge block layer 14 is formed from a high dielectric metal oxide. The high dielectric metal oxide is a metal oxide whose relative dielectric constant is higher than the relative dielectric constant of silicon nitride (approximately 7), and illustratively alumina, zirconia, hafnia, or tantalum oxide, or a mixture thereof. Alternatively, the charge block layer 14 can be formed from silicon oxide or silicon oxynitride. The thickness of the cap layer 20 is one atomic layer or more, and illustratively 0.5 to 3 nm.

Next, a method for manufacturing the nonvolatile semiconductor memory device 1 according to this embodiment is described.

FIGS. 2A and 2B to 7A and 7B are process cross-sectional views illustrating the method for manufacturing the nonvolatile semiconductor memory device according to this embodiment, where the figures with the suffix A show a cross section in the word line direction (channel width direction), and the figures with the suffix B show a cross section in the bit line direction (channel length direction).

Figure 2A:
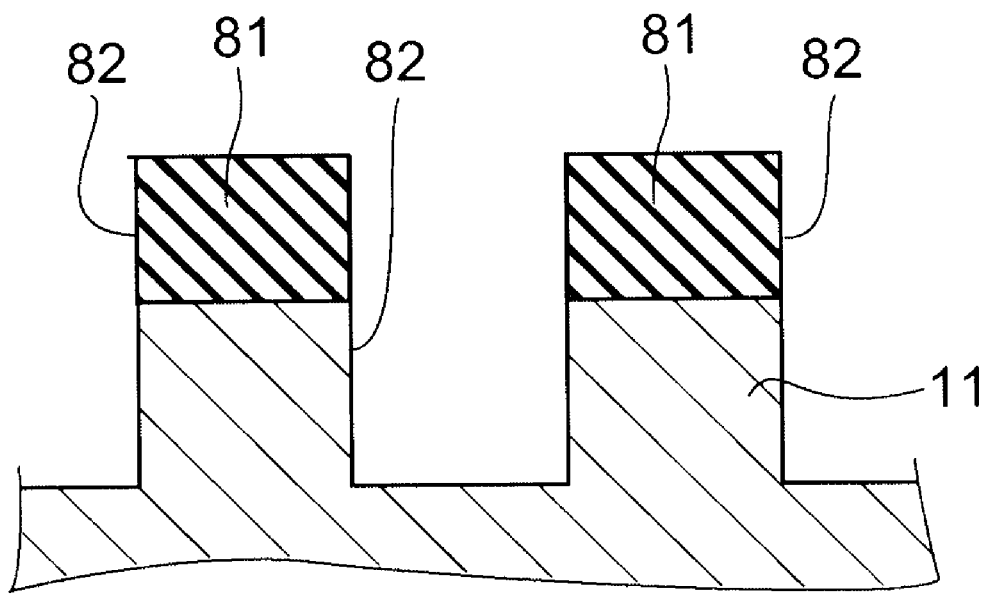
Figure 2B:
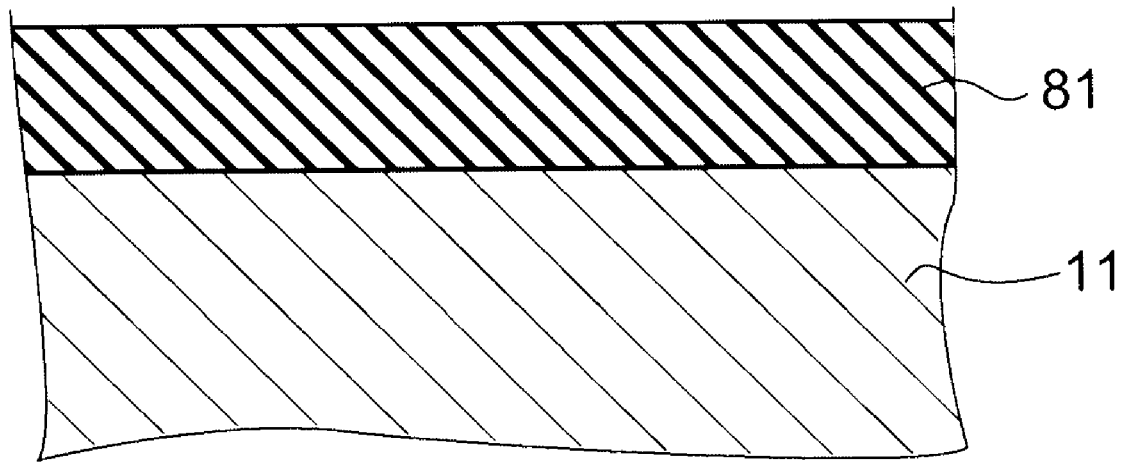

First, as shown in FIGS. 2A and 2B, a silicon substrate 11 having p-type conductivity and made of single crystal silicon is prepared. A CMP (chemical mechanical polishing) stopper material 81 is formed on the major surface (hereinafter referred to as "upper surface") of the silicon substrate 11. Next, the CMP stopper material 81 and an upper portion of the silicon substrate 11 are selectively removed by the lithography, RIE (reactive ion etching), and other processes to form device isolation trenches 82 extending in the bit line direction (channel length direction).

Figure 3A:
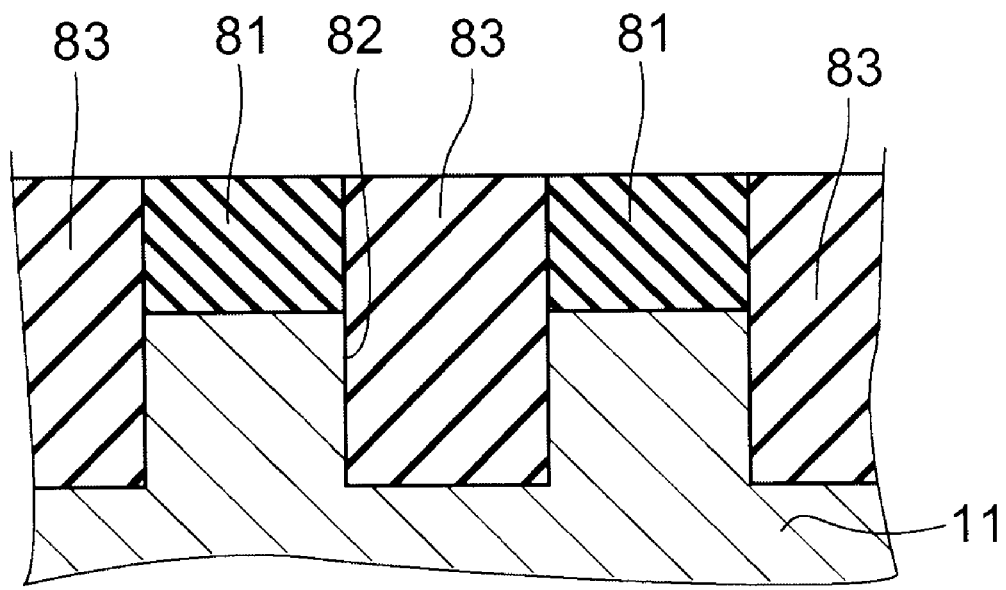
Figure 3B:
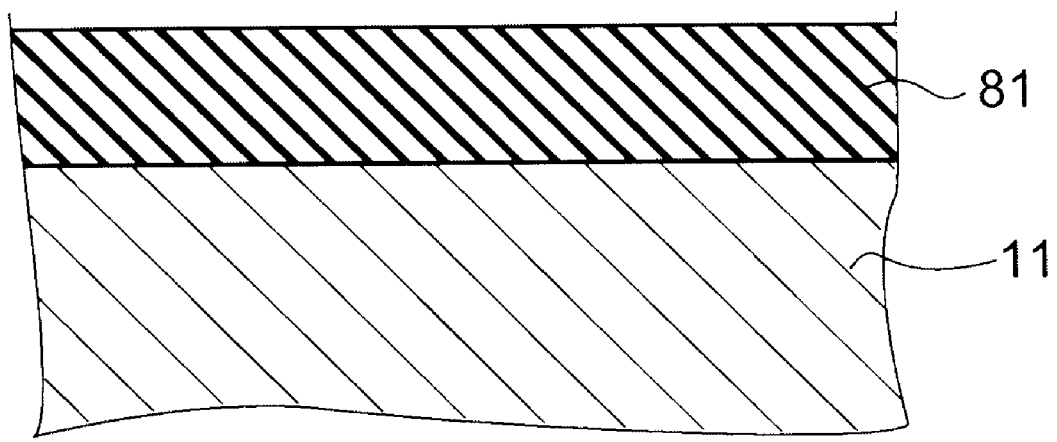

Next, as shown in FIGS. 3A and 3B, a device isolation insulating film 83 illustratively made of silicon oxide is buried in the device isolation trench 82. Then, CMP is performed until the CMP stopper material 81 is exposed. Thus, the upper surface of the CMP stopper material 81 and the device isolation insulating film 83 is planarized.

Figure 4A:
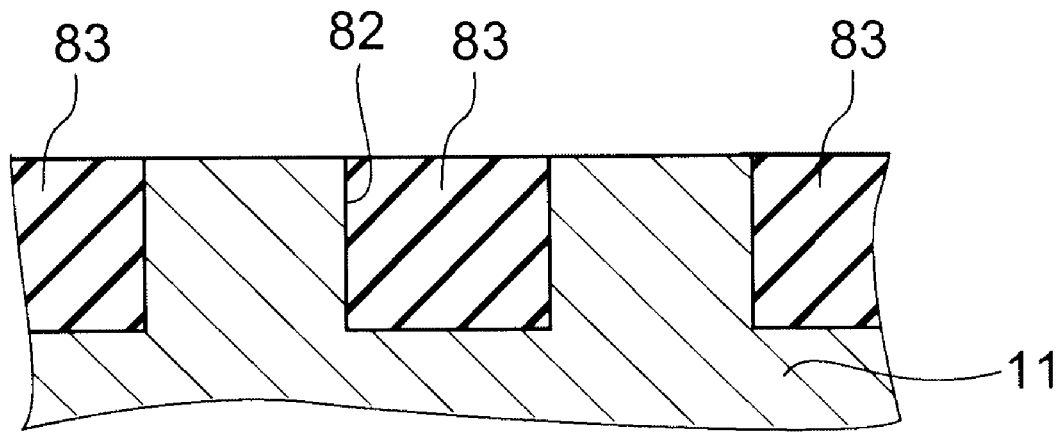
Figure 4B:
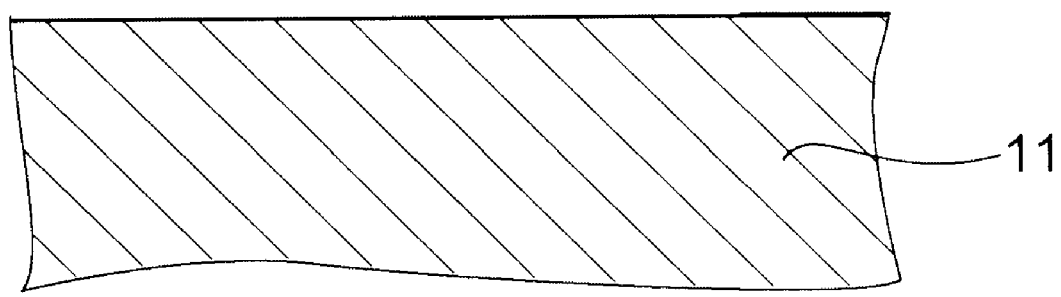

Next, as shown in FIGS. 4A and 4B, the CMP stopper material 81 (see FIG. 3) and an upper portion of the device isolation insulating film 83 are removed by wet etching to planarize the upper surface of the silicon substrate 11 and the device isolation insulating film 83.

Figure 5A:
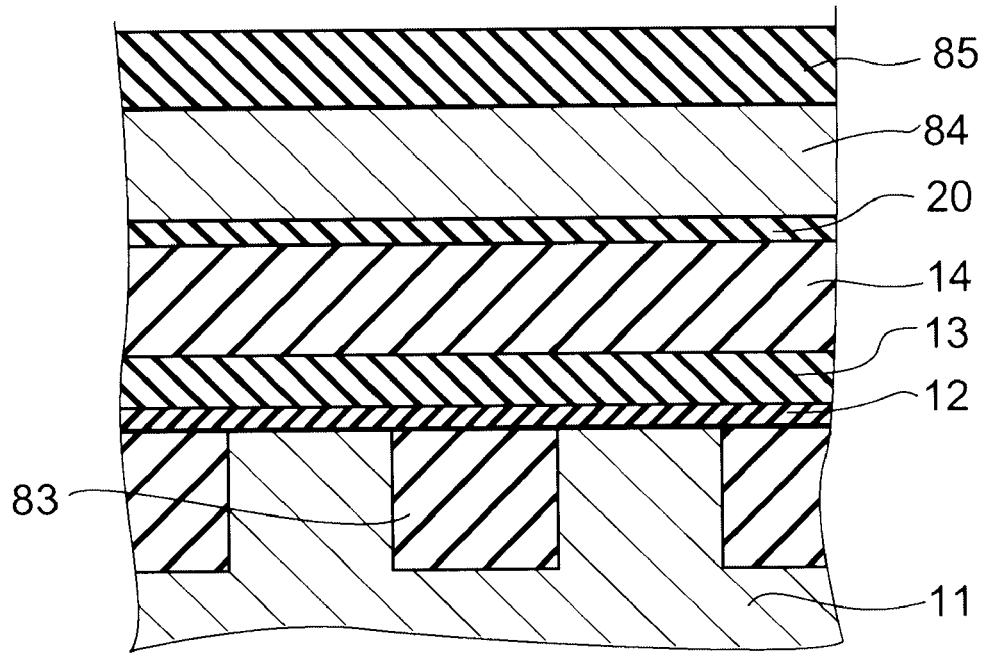
Figure 5B:
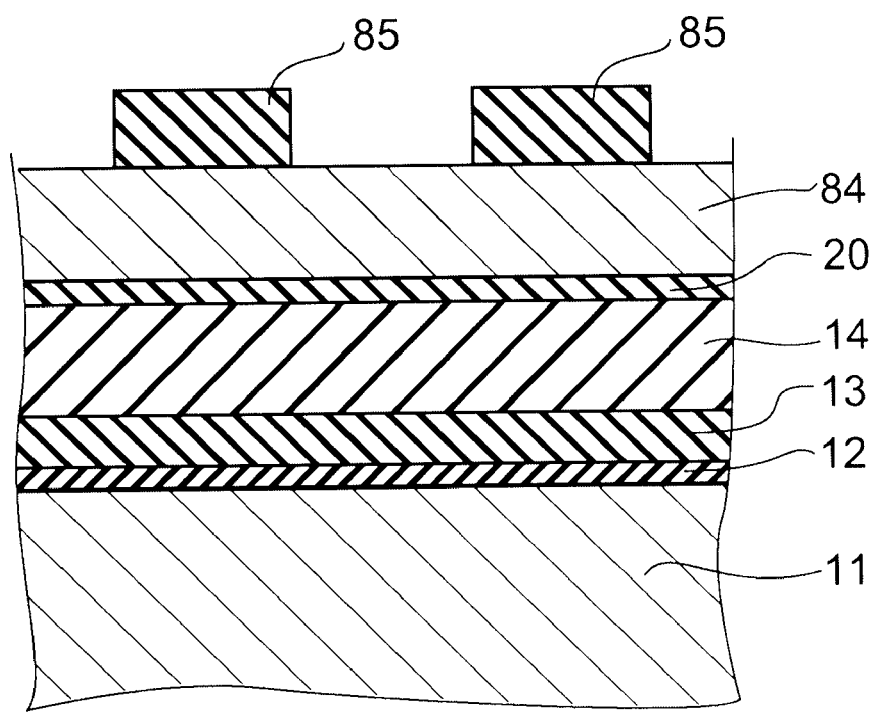

Next, as shown in FIGS. 5A and 5B, on the upper surface of the silicon substrate 11 and the device isolation insulating film 83, by the thermal oxidation, CVD (chemical vapor deposition), and other processes, a tunnel insulating layer 12 illustratively made of silicon oxide, a charge storage layer 13 illustratively made of silicon nitride, a charge block layer 14 illustratively made of alumina, a cap layer 20 made of silicon nitride, and a silicon conductive layer 84 containing dopants at high concentration are formed in this order. The silicon conductive layer 84 is turned to control gate electrodes 15 (see FIG. 1) in a later process. Next, a silicon nitride film, for instance, is deposited, and processed into a process mask 85 by the lithography, RIE, and other processes so that it has the pattern of the control gate electrodes 15 (see FIG. 1).

Figure 6A:
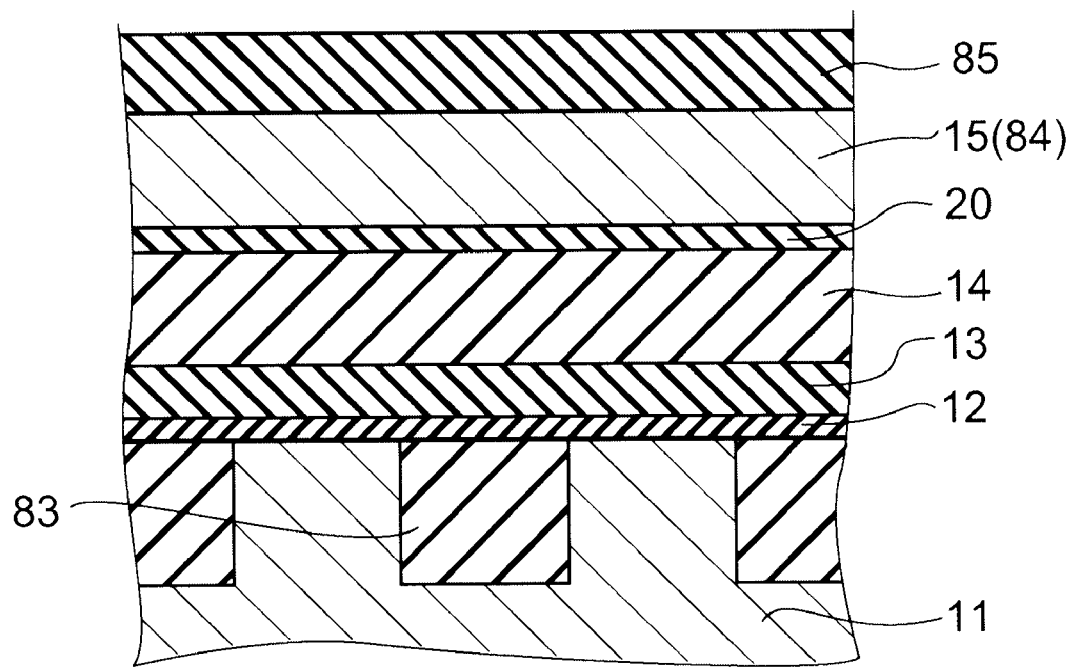
Figure 6B:
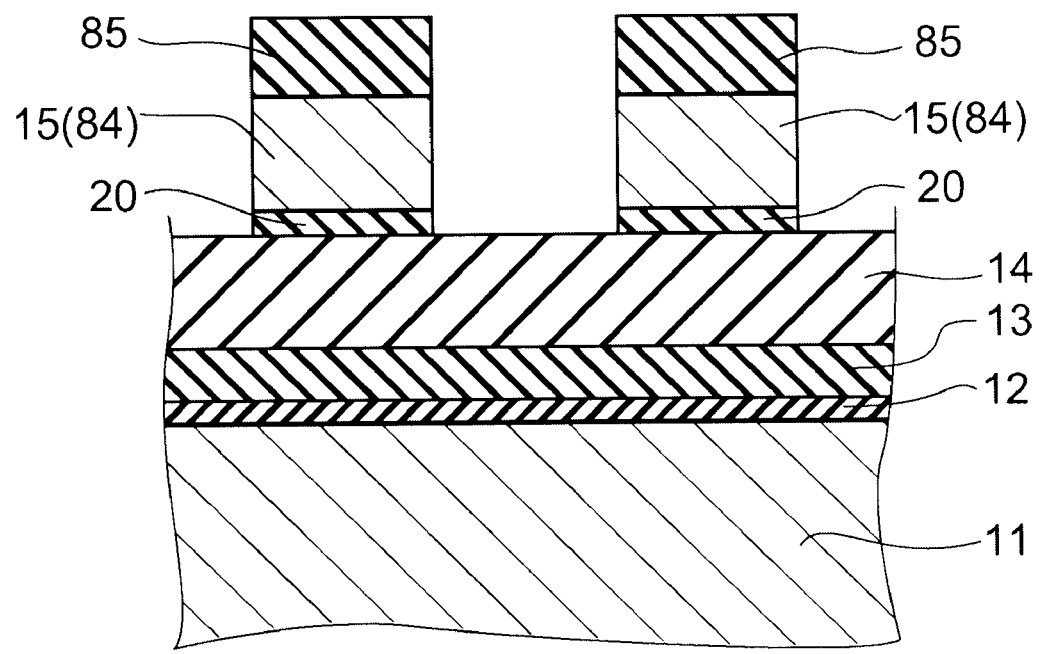

Next, as shown in FIGS. 6A and 6B, the process mask 85 is used as a mask to perform RIE or other etching to process the silicon conductive layer 84 and the cap layer 20 into a stripe shape. Thus, a plurality of line-shaped control gate electrodes 15 separated from each other by the silicon conductive layer 84 are formed, and the cap layer 20 is divided for each control gate electrode 15.

Figure 7A:
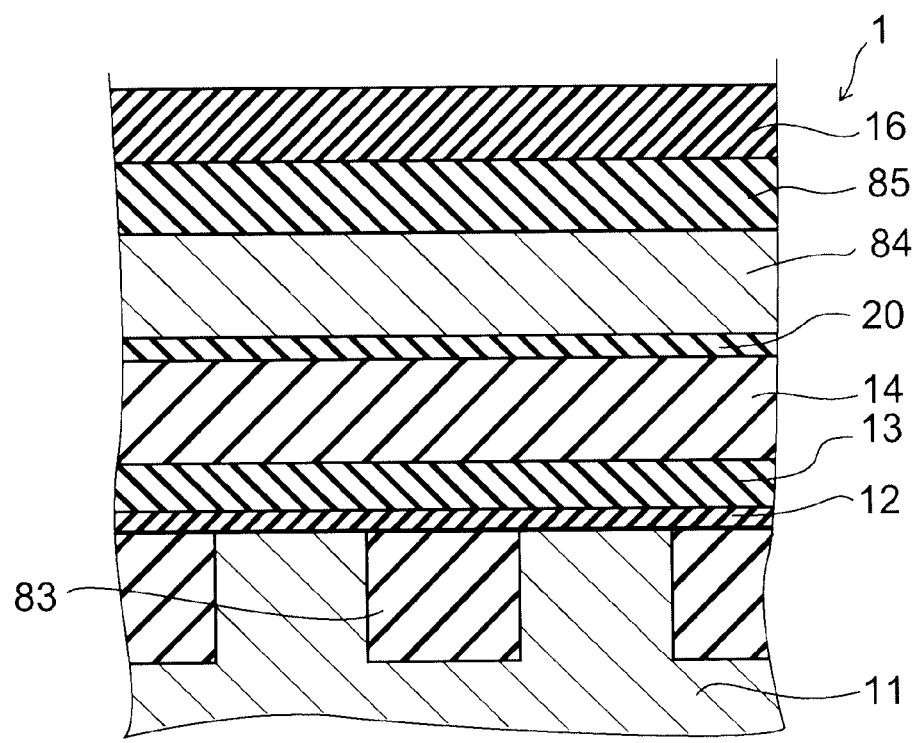
Figure 7B:
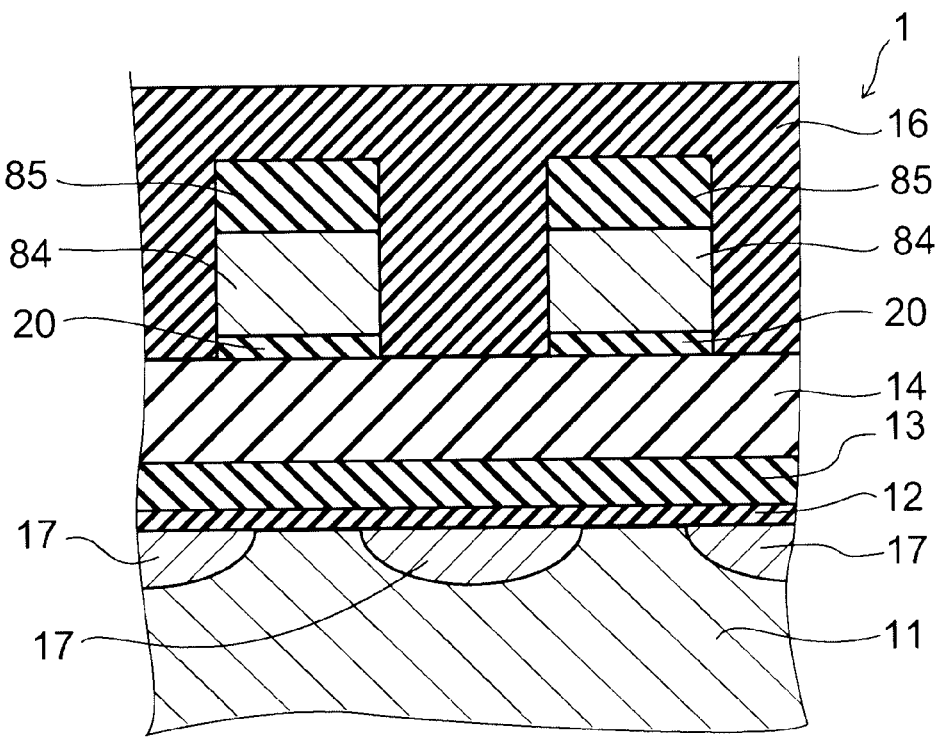

Next, as shown in FIGS. 7A and 7B, the process mask 85, the control gate electrode 15, and the cap layer 20 are used as a mask to ion-implant donors to form an impurity diffusion region 17 having n-type conductivity in an upper portion of the silicon substrate 11. This impurity diffusion region 17 functions as a source/drain after completion of the device 1. Next, silicon oxide, for instance, is deposited on the entire surface by the CVD or other process to form an interelectrode insulating film 16. At this time, the interelectrode insulating film 16 is buried also between the control gate electrodes 15. Subsequently, a MONOS type nonvolatile memory is completed using conventional techniques. Thus, the device 1 according to this embodiment is manufactured.

Next, the function and effect of this embodiment are described.

In this embodiment, a cap layer 20 made of silicon nitride is provided between the charge block layer 14 and the control gate electrode 15. Hence, the cell threshold voltage with the data erased (erase threshold voltage) can be lowered relative to the conventional MONOS type memory cell. Thus, the memory window can be expanded relative to the conventional MONOS type memory cell.

The inventors have discovered that in the conventional MONOS type memory cell without the cap layer 20, the decrease of the erase threshold voltage is saturated at a certain value even if the voltage applied between the control gate electrode 15 and the silicon substrate 11 is increased to lower the erase threshold voltage. The cause of this is considered as follows. Even if the charge stored in the charge storage layer 13 is attempted to be rapidly extracted to the silicon substrate 11, or even if a charge opposite in polarity to the charge stored in the charge storage layer 13 is attempted to be rapidly supplied from the silicon substrate 11 to the charge storage layer 13, charge flows from the control gate electrode 15 through the charge block layer 14 into the charge storage layer 13, and the amount of stored charge is difficult to decrease.

In contrast, the MONOS type memory cell of this embodiment has a lower erase threshold voltage than the conventional MONOS type memory cell without the cap layer 20. The reason for this is considered as follows. Because the cap layer 20 made of silicon nitride is provided, part of the charge flowing in at the beginning of erase operation is trapped in the cap layer 20. This prevents the subsequent flow of charge into the charge storage layer 13, and the erase threshold voltage becomes less likely to be saturated. To achieve such an effect, the material of the cap layer 20 preferably has charge trap states.

Furthermore, in this embodiment, because a cap layer 20 made of silicon nitride is provided between the charge block layer 14 and the control gate electrode 15, the cap layer 20 functions as a barrier layer during formation of the silicon conductive layer 84 and the subsequent manufacturing process. This can prevent chemical reaction and mutual diffusion of elements between the material forming the charge block layer 14 and the material forming the control gate electrode 15. For instance, this can prevent chemical reaction or mutual diffusion between alumina, zirconia, hafnia, or tantalum oxide forming the charge block layer 14 and silicon, metal, or metal silicide forming the control gate electrode 15. Alternatively, this can prevent chemical reaction or mutual diffusion between silicon oxide or silicon oxynitride forming the charge block layer 14 and metal or metal silicide forming the control gate electrode 15.

This serves to prevent insulation degradation of the charge block layer 14, and prevent variation in data retention characteristics and data program/erase characteristics between memory cells. Furthermore, this serves to prevent variation in the material properties of the control gate electrode 15, such as work function and electrical conductivity, and reduce variation in the cell threshold voltage. Furthermore, in a microscale memory cell, memory malfunctions due to variation in these characteristics can be avoided.

The thickness of the cap layer 20 is one atomic layer or more to achieve the aforementioned effect, and preferably 0.5 nm or more to achieve a remarkable effect. However, an excessively thick cap layer 20 results in increasing the thickness of the portion functioning as a gate insulating film of the memory cell, that is, the total thickness of the tunnel insulating layer 12, the charge storage layer 13, the charge block layer 14, and the cap layer 20. This decreases the capacitance of the gate insulating film, and unfortunately increases the operating voltage of the memory cell. Hence, in a microscale nonvolatile memory, the thickness of the cap layer 20 is preferably 3 nm or less.

The material constituting the cap layer 20 can be a silicon nitride primarily composed of silicon and nitrogen. In view of effectively preventing the aforementioned chemical reaction and mutual diffusion, the composition ratio of this silicon nitride is preferably close to 133% in terms of the ratio of nitrogen element concentration to silicon element concentration. However, the effect of this embodiment, that is, the effect of expanding the memory window and the effect of preventing the chemical reaction and mutual diffusion, can be sufficiently achieved as long as the composition ratio, if shifted, is in the range from 120% to 150%. Furthermore, the above effect can be sufficiently achieved even if any impurity element, such as hydrogen or oxygen, is contained at approximately 10%.

Next, a first comparative example of this embodiment is described.

Figure 8:
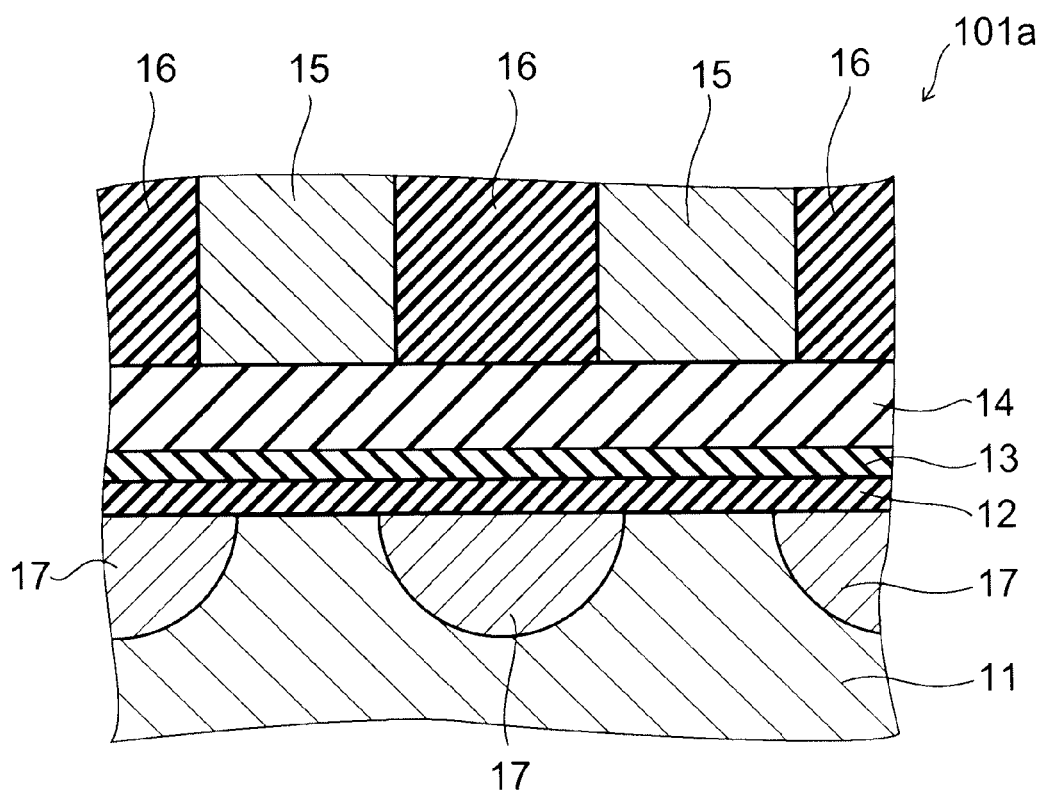
FIG. 8 is a cross-sectional view illustrating a nonvolatile semiconductor memory device according to a first comparative example of the first embodiment.

FIG. 8 is a cross-sectional view illustrating a nonvolatile semiconductor memory device according to this comparative example.

FIG. 8 shows a cross section corresponding to FIG. 1.

As shown in FIG. 8, the device 101a according to this comparative example is different from the device 1 (see FIG. 1) according to the first embodiment in that no cap layer 20 (see FIG. 1) is provided and that the control gate electrode 15 is in contact with the charge block layer 14. Hence, the erase threshold voltage tends to be saturated, and the memory window is difficult to expand.

Furthermore, in the process of forming the control gate electrode 15 and the subsequent process, chemical reaction or mutual diffusion of elements occurs between the material forming the control gate electrode 15 and the material forming the charge block layer 14. This decreases the insulation capability of the charge block layer 14, causing variation in data retention characteristics and data program/erase characteristics between memory cells. Furthermore, this varies the material property values of the control gate electrode 15, causing variation in the cell threshold voltage. These problems are remarkable particularly in the case where the charge block layer 14 is made of a high dielectric metal oxide and the control gate electrode 15 is made of silicon, metal, or metal silicide, and the case where the charge block layer 14 is made of silicon oxide or silicon oxynitride and the control gate electrode 15 is made of metal or metal silicide.

In contrast, in the above first embodiment, a cap layer 20 made of silicon nitride is provided between the charge block layer 14 and the control gate electrode 15. Hence, this cap layer 20 serves as a barrier to prevent the chemical reaction and mutual diffusion. This effect is remarkable particularly in the case where the charge block layer 14 is made of a high dielectric metal oxide and the control gate electrode 15 is made of silicon, metal, or metal silicide, and the case where the charge block layer 14 is made of silicon oxide or silicon oxynitride and the control gate electrode 15 is made of metal or metal silicide.

Next, a second comparative example of this embodiment is described.

Figure 9:
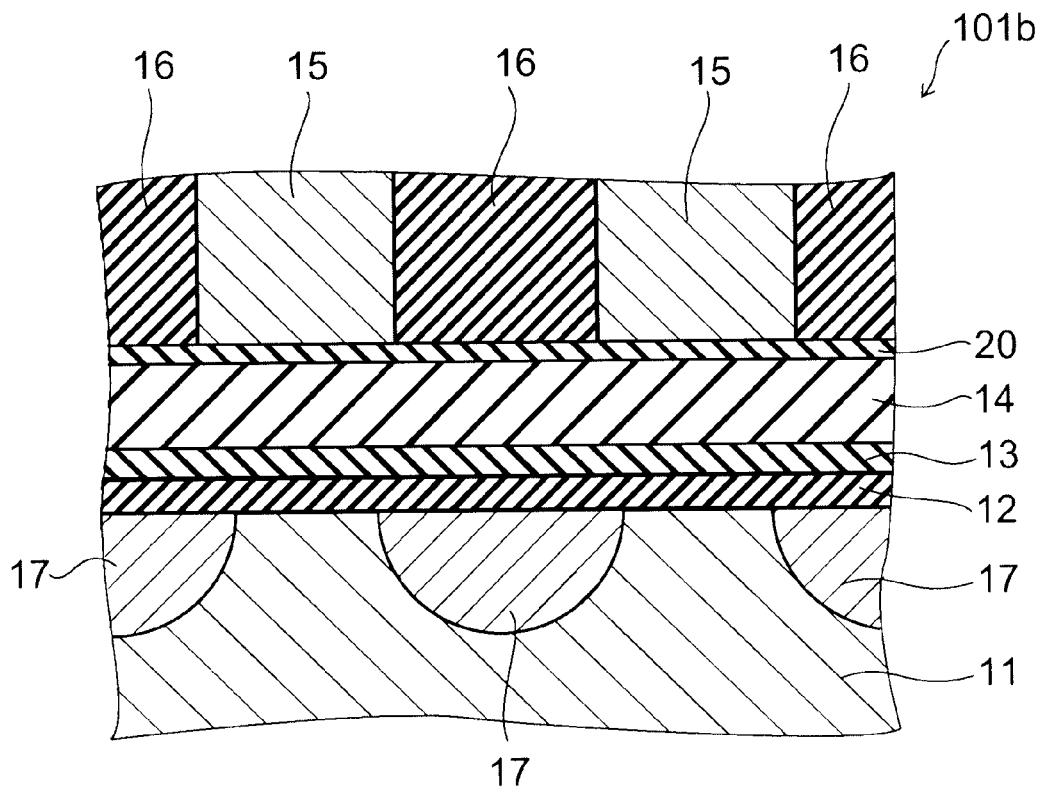
FIG. 9 is a cross-sectional view illustrating a nonvolatile semiconductor memory device according to a second comparative example of the first embodiment.

FIG. 9 is a cross-sectional view illustrating a nonvolatile semiconductor memory device according to this comparative example.

FIG. 9 shows a cross section corresponding to FIG. 1.

As shown in FIG. 9, the device 101b according to this comparative example is different from the device 1 (see FIG. 1) according to the first embodiment in that the cap layer 20 is not divided for each control gate electrode 15 but continuously formed. That is, the cap layer 20 is formed not only between the control gate electrode 15 and the charge block layer 14 but also between the interelectrode insulating film 16 and the charge block layer 14.

Also in this comparative example, like the above first embodiment, it is indeed possible to expand the memory window. Furthermore, it is also possible to prevent chemical reaction and mutual diffusion between the control gate electrode 15 and the charge block layer 14. However, if the configuration of this comparative example is applied to a microscale device, part of the charge trapped in the cap layer 20 during erase operation is moved from immediately below the control gate electrode 15 to immediately below the region between the control gate electrodes 15 and stored therein by the self-electric field or the potential difference relative to the adjacent memory cell. The amount of this charge stored immediately below the region between the control gate electrodes varies if left standing over time. This varies the threshold voltage of the memory cell and lowers the data retention characteristics. Furthermore, storage of charge immediately below the region between the control gate electrodes results in varying the threshold voltage of the adjacent memory cell.

In contrast, in the above first embodiment, the cap layer 20 is divided for each control gate electrode 15, and hence these problems are avoided. Here, even in the case where the cap layer is not completely separated, the aforementioned problems are alleviated if, for instance, the portion of the cap layer located between the control gate electrodes is formed from a silicon oxynitride having a lower nitrogen content than the portion located immediately below the control gate electrode. For instance, for a memory cell spacing of 30 nm or more, the aforementioned problems are substantially negligible if the nitrogen content in the portion of the cap layer located immediately below the region between the control gate electrodes is 1/3 or less of the nitrogen content in the portion located immediately below the control gate electrode. Furthermore, the aforementioned problems are alleviated also if the thickness of the portion between the control gate electrodes is thinner than the thickness of the portion immediately below the control gate electrode. For instance, for a memory cell spacing of 30 nm or more, the aforementioned problems are substantially negligible if the thickness of the portion of the cap layer located immediately below the region between the control gate electrodes is 1/3 or less of the thickness of the portion located immediately below the control gate electrode.

Next, a second embodiment of the invention is described.

Figure 10:
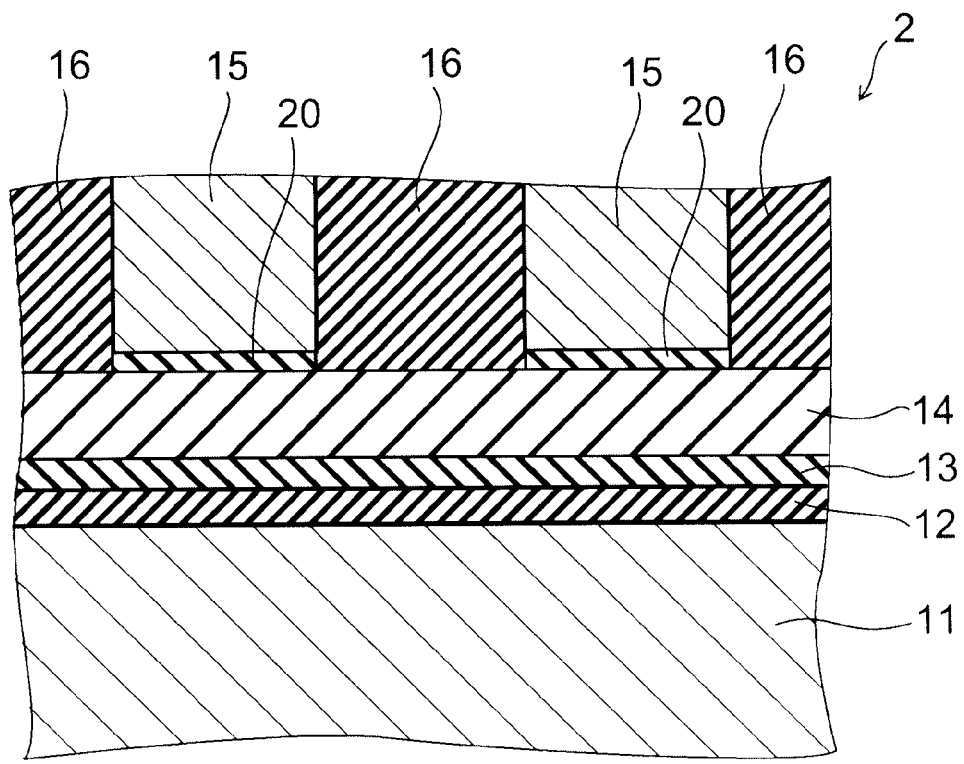
FIG. 10 is a cross-sectional view illustrating a nonvolatile semiconductor memory device according to a second embodiment of the invention.

FIG. 10 is a cross-sectional view illustrating a nonvolatile semiconductor memory device according to this embodiment.

Like FIG. 1, FIG. 10 shows a cross section of a MONOS type memory cell in the bit line direction (channel length direction).

As shown in FIG. 10, the nonvolatile semiconductor memory device 2 according to this embodiment is different from the device 1 (see FIG. 1) according to the above first embodiment in that the silicon substrate 11 has n-type conductivity and that no impurity diffusion region 17 (see FIG. 1) is formed therein. That is, the memory cell of this embodiment is a MONOS type memory cell using a depression type cell transistor. Furthermore, the method for manufacturing the device 2 is different from the method for manufacturing the device 1 in that the silicon substrate 11 is an n-type substrate and that the ion implantation step shown in FIG. 7 is omitted. The configuration, manufacturing method, and function and effect of this embodiment other than the foregoing are the same as those of the above first embodiment.

Next, a first comparative example of this embodiment is described.

Figure 11:
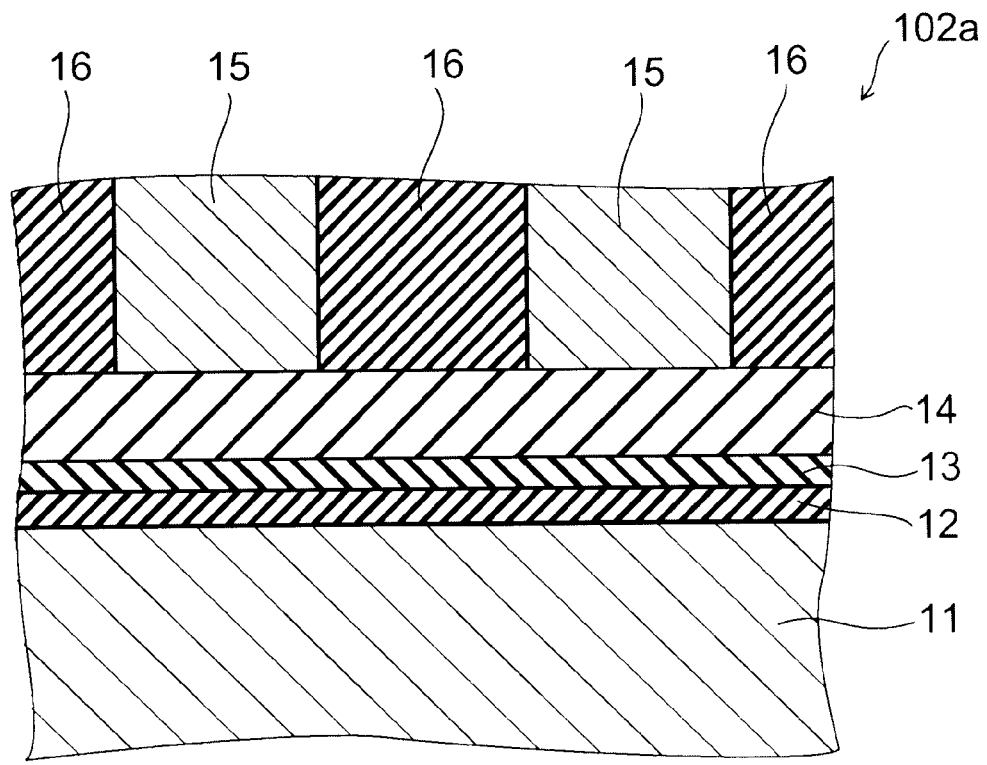
FIG. 11 is a cross-sectional view illustrating a nonvolatile semiconductor memory device according to a first comparative example of the second embodiment.

FIG. 11 is a cross-sectional view illustrating a nonvolatile semiconductor memory device according to this comparative example.

As shown in FIG. 11, the device 102a according to this comparative example is different from the device 2 (see FIG. 10) according to the second embodiment in that no cap layer is formed. Hence, the erase threshold voltage tends to be saturated, and the memory window is difficult to expand. Furthermore, chemical reaction or mutual diffusion occurs between the charge block layer 14 and the control gate electrode 15, causing variation in the characteristics of memory cells.

Next, a second comparative example of this embodiment is described.

Figure 12:
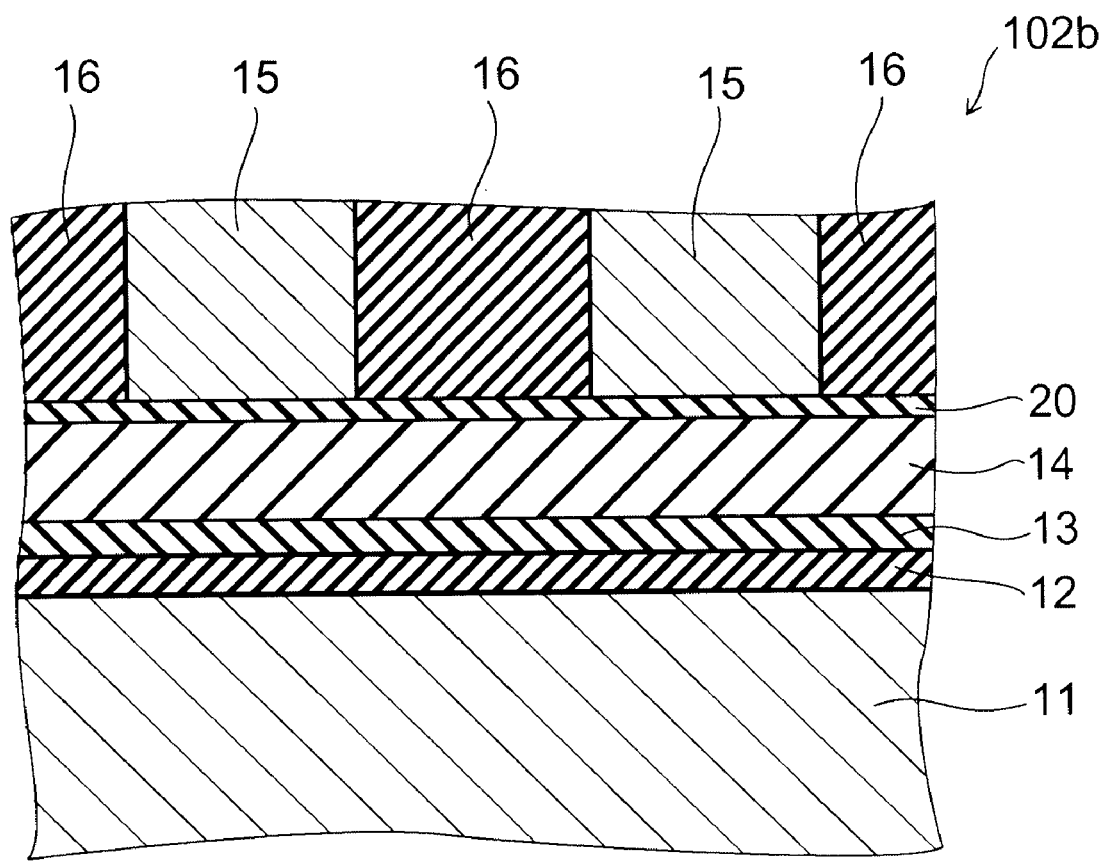
FIG. 12 is a cross-sectional view illustrating a nonvolatile semiconductor memory device according to a second comparative example of the second embodiment.

FIG. 12 is a cross-sectional view illustrating a nonvolatile semiconductor memory device according to this comparative example.

As shown in FIG. 12, the device 102b according to this comparative example is different from the device 2 (see FIG. 10) according to the second embodiment in that the cap layer 20 is formed also between the control gate electrodes 15. Hence, charge is stored in the cap layer 20 located between the control gate electrodes 15, lowering the data retention characteristics of the memory cell and varying the threshold voltage.

Next, a third embodiment of the invention is described.

Figure 13:
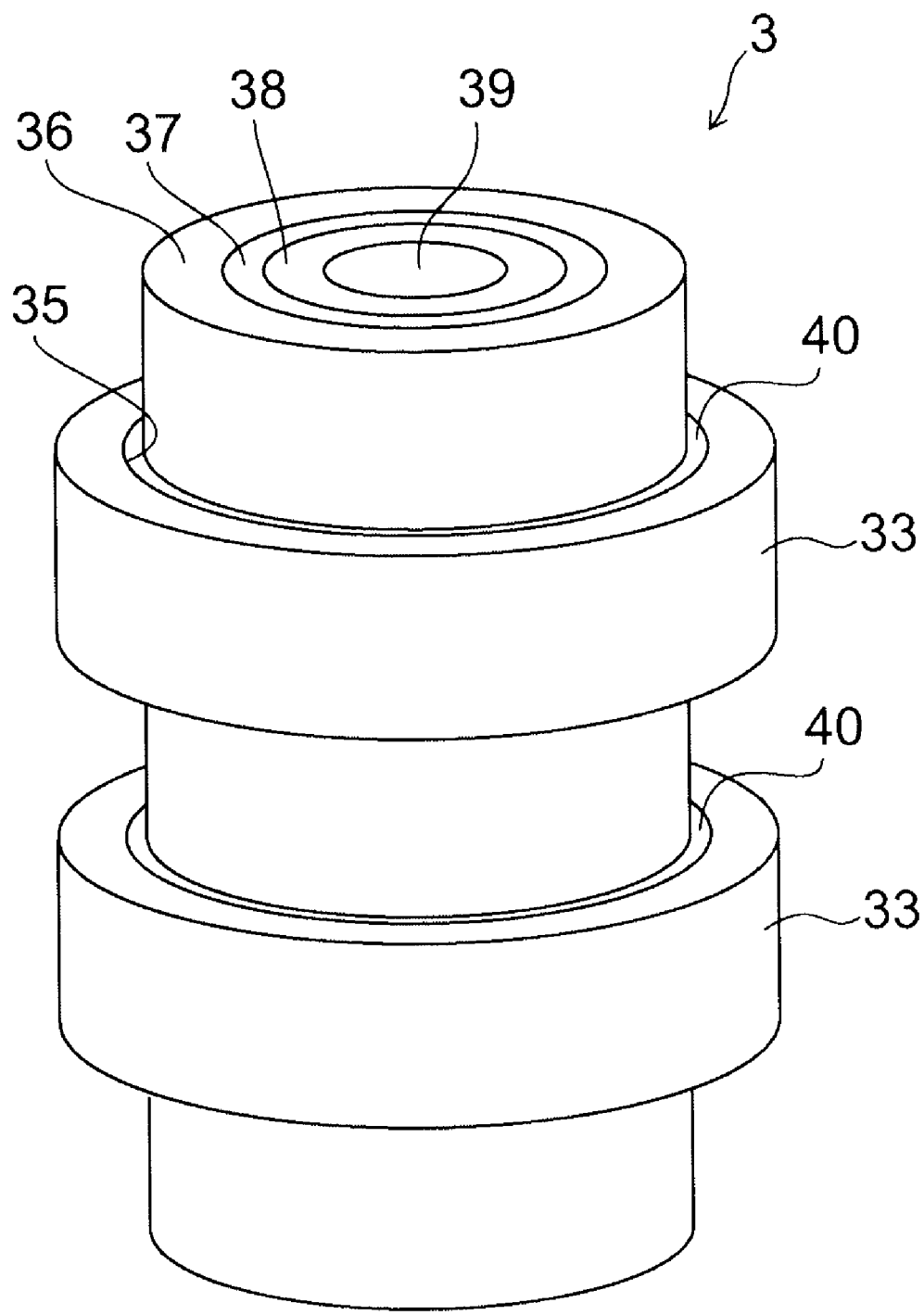
FIG. 13 is a perspective view illustrating a nonvolatile semiconductor memory device according to a third embodiment of the invention.

FIG. 13 is a perspective view illustrating a nonvolatile semiconductor memory device according to this embodiment.

Figure 14:
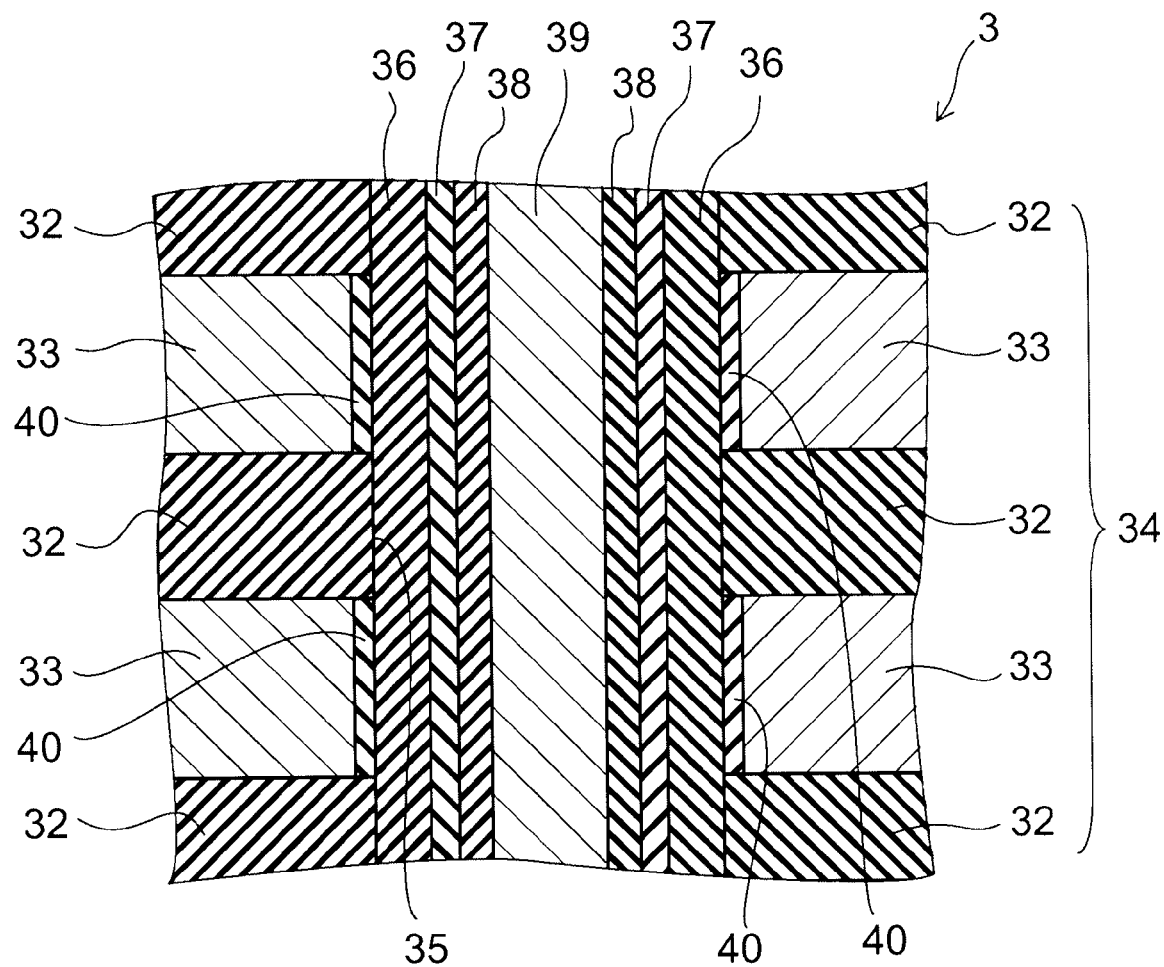
FIG. 14 is a cross-sectional view illustrating the nonvolatile semiconductor memory device according to the third embodiment.

FIG. 14 is a cross-sectional view illustrating the nonvolatile semiconductor memory device according to this embodiment.

In FIG. 13, the interelectrode insulating film is not shown.

As shown in FIGS. 13 and 14, in the nonvolatile semiconductor memory device 3 according to this embodiment, a multilayer structure body 34 with interelectrode insulating films 32 and control gate electrodes 33 alternately stacked therein is formed on a semiconductor substrate 31 (see FIG. 15). The thickness of the interelectrode insulating film 32 and the control gate electrode 33 is illustratively 50 nm each. Furthermore, the multilayer structure body 34 includes a plurality of cylindrical trenches 35 extending in a stacking direction.

Furthermore, a charge block layer 36, a charge storage layer 37, and a tunnel insulating layer 38 are formed in this order on the inner surface of the trench 35, and a cylindrical silicon pillar 39 is buried as a semiconductor member inside the trench 35. The silicon pillar 39 functions as a channel layer of the memory cell transistor. Furthermore, a cap layer 40 made of silicon nitride is formed between the control gate electrode 33 and the charge block layer 36.

Next, a method for manufacturing the nonvolatile semiconductor memory device 3 according to this embodiment is described.

FIGS. 15A and 15B to 18A and 18B are process views illustrating the method for manufacturing the nonvolatile semiconductor memory device according to this embodiment, where the figures with the suffix A show a cross section in the channel length direction, and the figures with the suffix B show a plan view.

Figure 15A:
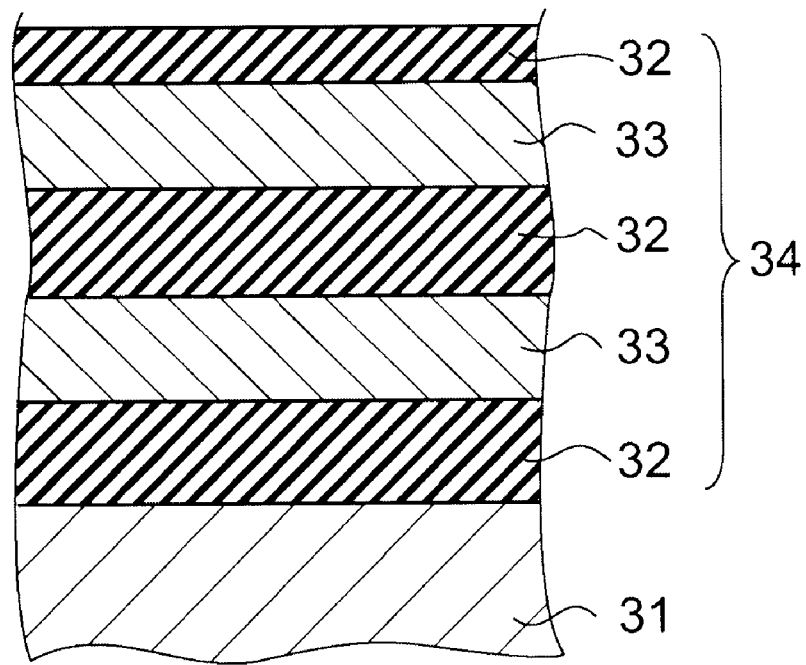
Figure 15B:
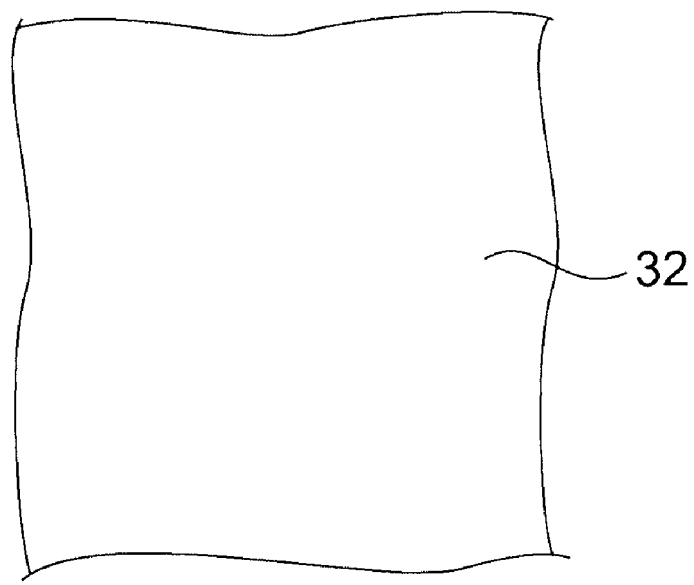

First, as shown in FIGS. 15A and 15B, a semiconductor substrate 31 is prepared. The semiconductor substrate 31 is illustratively a single crystal silicon substrate. On the semiconductor substrate 31, by the CVD or other process, an interelectrode insulating film 32 primarily composed of silicon oxide and a control gate electrode 33 primarily composed of silicon are alternately and repetitively stacked to form a multilayer structure body 34. Here, "primarily composed of" refers to containing at least 50 atomic percent. The interelectrode insulating film 32 is illustratively a silicon oxide film, and the control gate electrode 33 is illustratively a silicon film containing dopants at high concentration.

Figure 16A:
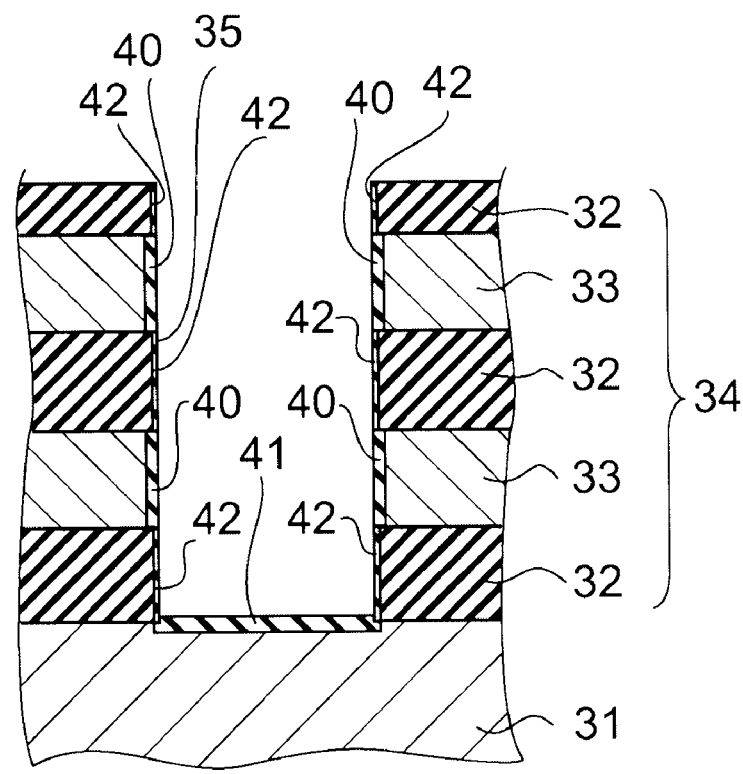
Figure 16B:
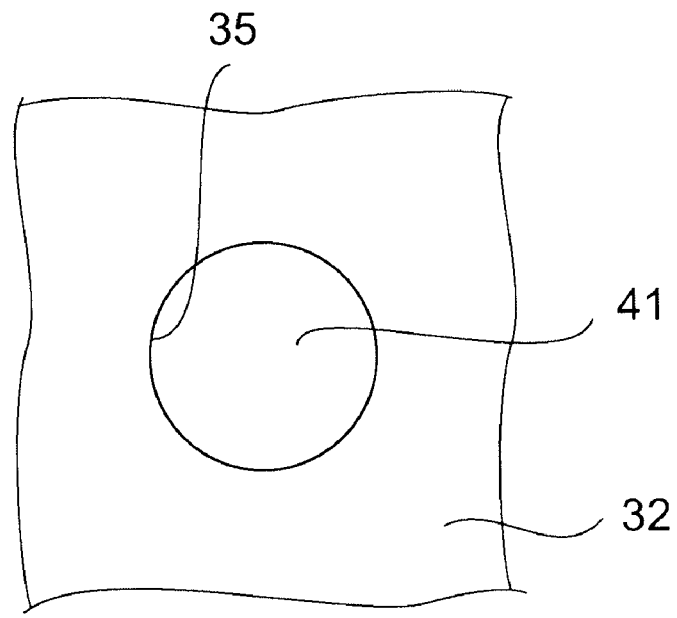

Next, as shown in FIGS. 16A and 16B, by the RIE or other process, a trench 35 reaching the semiconductor substrate 31 is formed in the multilayer structure body 34. The trench 35 is illustratively shaped like a cylinder extending in the stacking direction of the multilayer structure body 34. At this time, the interelectrode insulating films 32 and the control gate electrodes 33 are exposed to the side surface of the trench 35. The trench 35 is formed in a plurality, and illustratively formed in a matrix as viewed from above.

Next, in a chamber illustratively maintained at a relatively high pressure from 30 Pa to 1 kPa, and more preferably from 50 Pa to 500 Pa, a raw material gas primarily composed of nitrogen gas is excited into a plasma by microwaves, RF waves, electron cyclotron resonance or the like to form a plasma atmosphere containing electrically neutral nitrogen radicals at high density. Here, the applied power condition and the condition of additive gas, such as inert gas, can be determined so that the density of neutral nitrogen radicals is in the range from $1 \times 10^9$ cm$^{-3}$ to $1 \times 10^{16}$ cm$^{-3}$, and more preferably in the range from $1 \times 10^{11}$ cm$^{-3}$ to $1 \times 10^{14}$ cm$^{-3}$, and it is illustratively set to $1 \times 10^{12}$ cm$^{-3}$ to $1 \times 10^{13}$ cm$^{-3}$. By this setting of the lower limit of the density of neutral nitrogen radicals, formation of the silicon nitride layer required to achieve the effect of this embodiment can be performed within a practical time period. On the other hand, this setting of the upper limit of the density can prevent particles and contaminants from dropping from the inner wall of the chamber onto the semiconductor substrate 31 during the formation of the silicon nitride layer.

Thus, by forming a plasma atmosphere containing neutral nitrogen radicals in the chamber, the nitrogen radicals are introduced into the trench 35 and nitridize the inner surface of the trench 35. Here, at the inner surface of the trench 35, the control gate electrode 33 is selectively nitridized relative to the interelectrode insulating film 32. In particular, as the pressure in the chamber is set higher, the energy of the nitrogen radical decreases, and the nitrogen atom is more easily inserted into the Si—Si bond constituting the control gate electrode 33 than into the Si—O bond constituting the interelectrode insulating film 32. Thus, the selectivity of the nitridation reaction can be increased. However, if the pressure in the chamber is too high, the rate of nitridation reaction decreases. Hence, as described above, preferably, the pressure in the chamber is set in the range, for instance, from 50 Pa to 500 Pa.

For instance, a silicon oxynitride layer 42 having a thickness of only approximately 1 nm is formed at the exposed surface of the interelectrode insulating film 32 illustratively made of silicon oxide. In contrast, a silicon nitride layer having a thickness of approximately 2 nm is formed at the exposed surface of the control gate electrode 33 illustratively made of silicon, and serves as a cap layer 40. At this time, a nitride layer 41 is formed also at the upper surface of the semiconductor substrate 31 exposed to the bottom surface of the trench 35. For instance, in the case where the semiconductor substrate 31 is made of silicon, the nitride layer 41 is formed from silicon nitride.

Figure 17A:
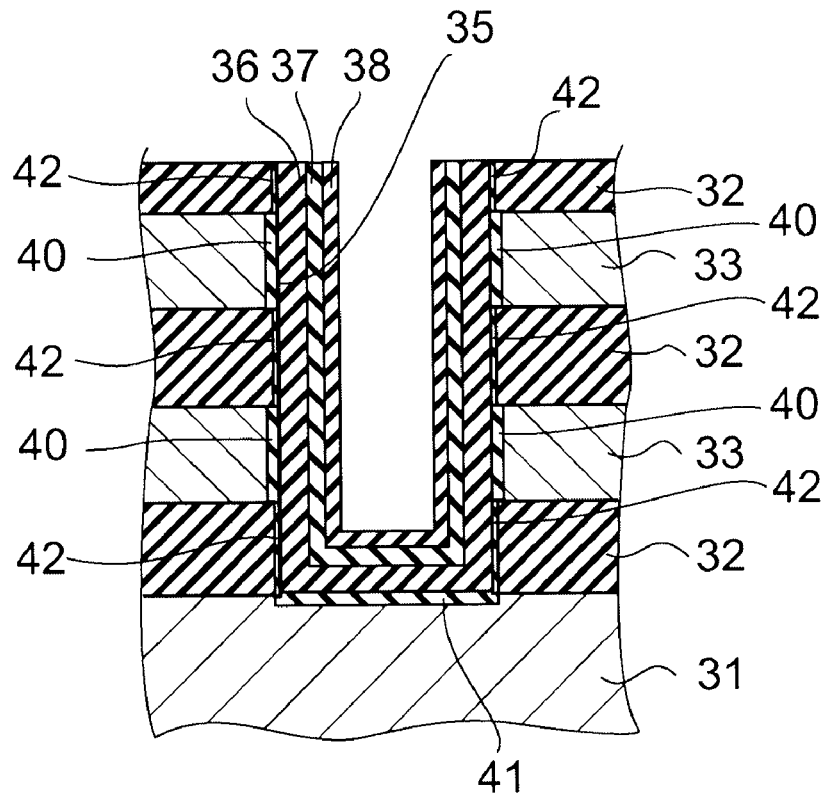
Figure 17B:
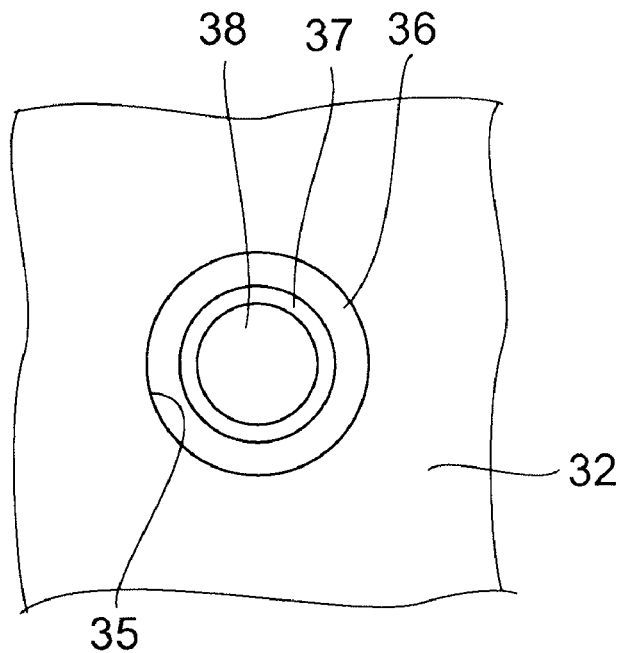

Next, as shown in FIGS. 17A and 17B, on the inner surface of the trench 35, a charge block layer 36 made of a high dielectric metal oxide, such as alumina, and having a thickness of approximately 10 to 20 nm is formed illustratively by the atomic layer deposition (ALD) process. Here, by using the atomic layer deposition process, the charge block layer 36 can be formed nearly uniformly on the inner surface of the trench 35. Furthermore, at this time, by depositing the high dielectric metal oxide, the silicon oxynitride layer 42 is oxidized, and the nitrogen content in the silicon oxynitride layer 42 becomes 10% or less.

Subsequently, a charge storage layer 37 illustratively made of silicon nitride and having a thickness of approximately 2 to 5 nm is formed illustratively by the ALD process. Next, a tunnel insulating layer 38 illustratively made of silicon oxide and having a thickness of approximately 5 to 10 nm is formed illustratively by the ALD process. Subsequently, the tunnel insulating layer 38, the charge storage layer 37, and the charge block layer 36 formed on the multilayer structure body 34 are removed by the CMP process.

Figure 18A:
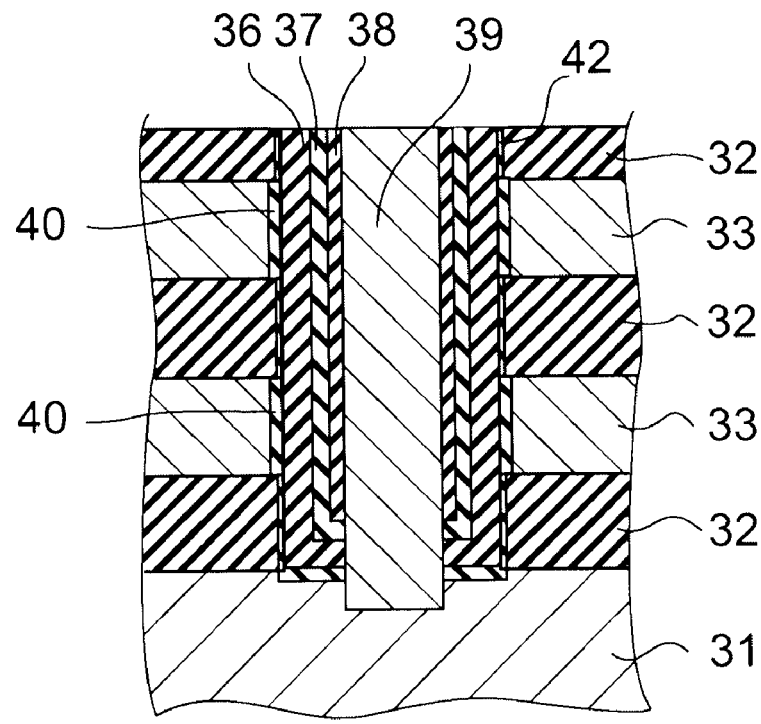
Figure 18B:
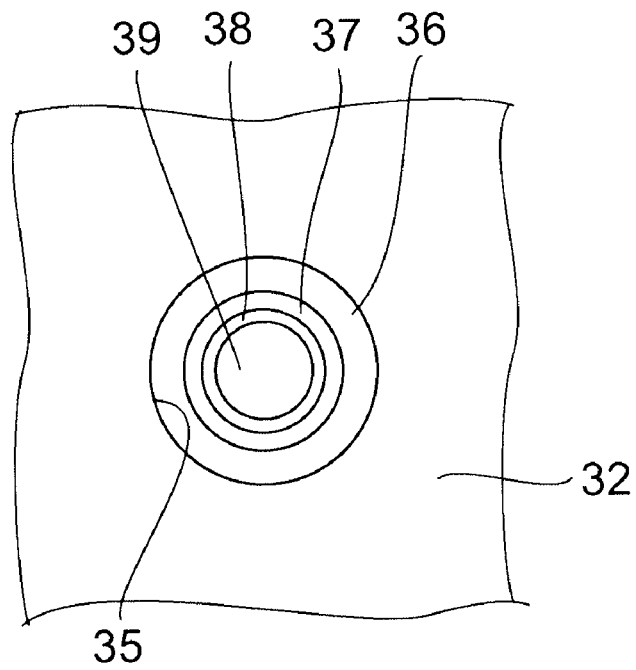

Next, as shown in FIGS. 18A and 18B, by the RIE or other process, the tunnel insulating layer 38, the charge storage layer 37, the charge block layer 36, and the nitride layer 41 formed at the bottom of the trench 35 are removed, and furthermore, an upper portion of the semiconductor substrate 31 is removed. Thus, at the bottom surface of the trench 35, the semiconductor substrate 31 is dug down and exposed. Subsequently, by the CVD or other process, amorphous silicon containing n-type impurities (donors) is buried inside the trench 35. Next, by annealing at a temperature of e.g. approximately 500 to 600° C., this amorphous silicon is crystallized starting at the surface in contact with the semiconductor substrate 31. Thus, a silicon pillar 39 epitaxially grown from the semiconductor substrate 31 and made of a silicon crystal containing n-type impurities is formed in the trench 35. Here, the crystallinity of the silicon crystal forming the silicon pillar 39 is inherited from the crystallinity of the semiconductor substrate 31. Hence, the silicon pillar 39 has good crystallinity with few crystal defects. Subsequently, a MONOS type nonvolatile memory having a three-dimensional structure is completed using conventional techniques. Thus, the device 3 is manufactured.

Next, the function and effect of this embodiment are described.

Also in this embodiment, like the above first embodiment, a cap layer 40 made of silicon nitride is formed between the charge block layer 36 and the control gate electrode 33. Hence, saturation of the erase threshold voltage is prevented, and the memory window can be expanded. Furthermore, this cap layer 40 functions as a barrier layer, and can prevent chemical reaction and mutual diffusion of elements between the material forming the charge block layer 36 and the material forming the control gate electrode 33. This serves to prevent variation in data retention characteristics, data program/erase characteristics, and cell threshold voltage between memory cells. Furthermore, in a microscale memory cell, memory malfunctions due to variation in these characteristics can be avoided.

Furthermore, the cap layer 40 made of silicon nitride is formed only between the charge block layer 36 and the control gate electrode 33, and not formed between the charge block layer 36 and the interelectrode insulating film 32. Indeed, between the charge block layer 36 and the interelectrode insulating film 32 is formed a thin silicon oxynitride layer 42. However, this is not made of silicon nitride having charge retention capability, but made of silicon oxynitride, which, in addition, has a lowered nitrogen content due to oxidation by deposition of a high dielectric metal oxide constituting the charge block layer 36. Hence, the cap layer 40 made of silicon nitride is substantially divided for each control gate electrode 33. Thus, no substantial charge is stored between the charge block layer 36 and the interelectrode insulating film 32, and the operation of the memory cell is not affected.

In this embodiment described above, a cylindrical silicon pillar 39 electrically connected to the semiconductor substrate 31 is used as a channel layer. However, the invention is not limited thereto. For instance, a U-shaped semiconductor pillar electrically insulated from the semiconductor substrate can also be used as a channel layer.

Next, a comparative example of this embodiment is described.

Figure 19:
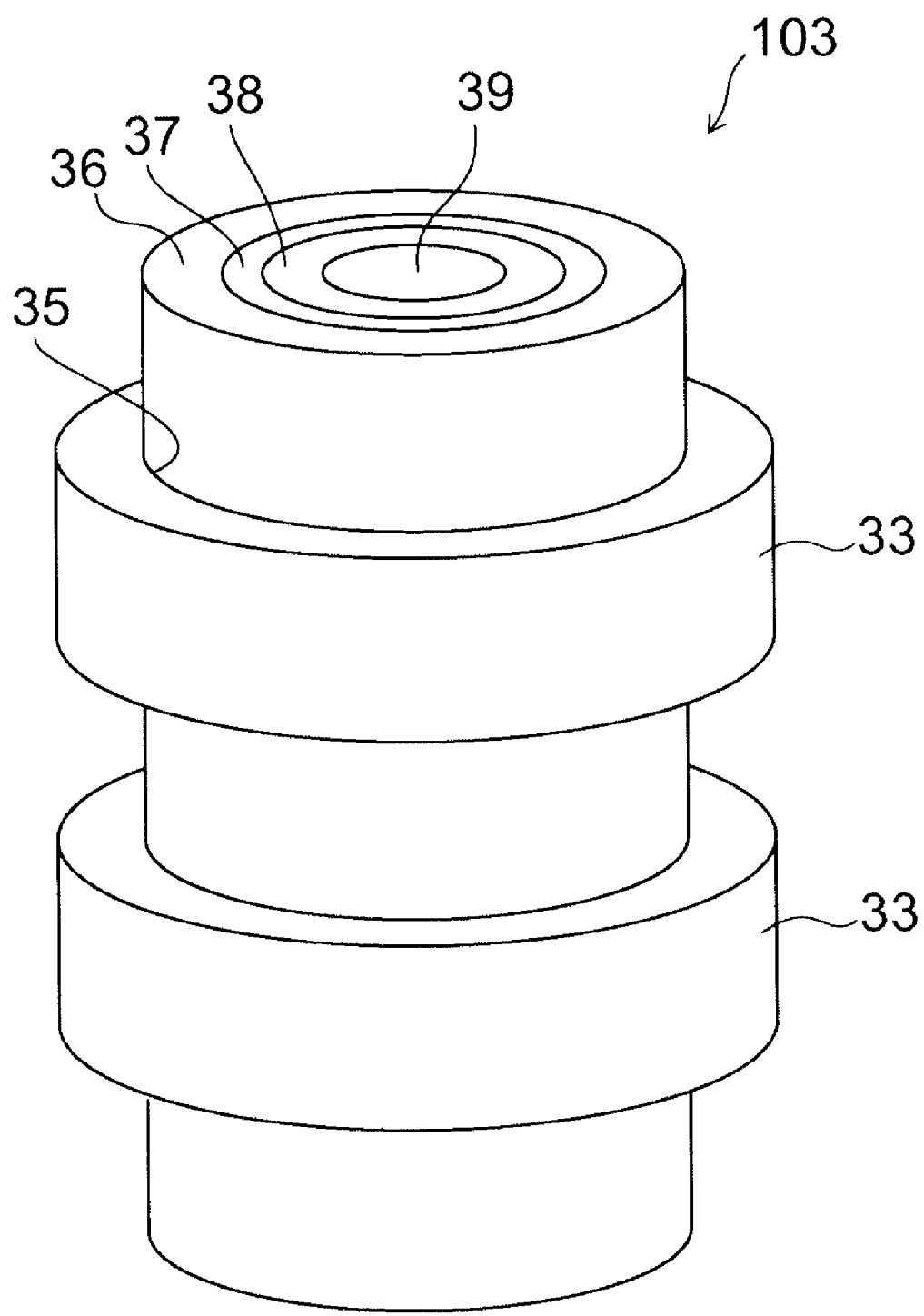
FIG. 19 is a perspective view illustrating a nonvolatile semiconductor memory device according to a comparative example of the third embodiment.

FIG. 19 is a perspective view illustrating a nonvolatile semiconductor memory device according to this comparative example.

Figure 20:
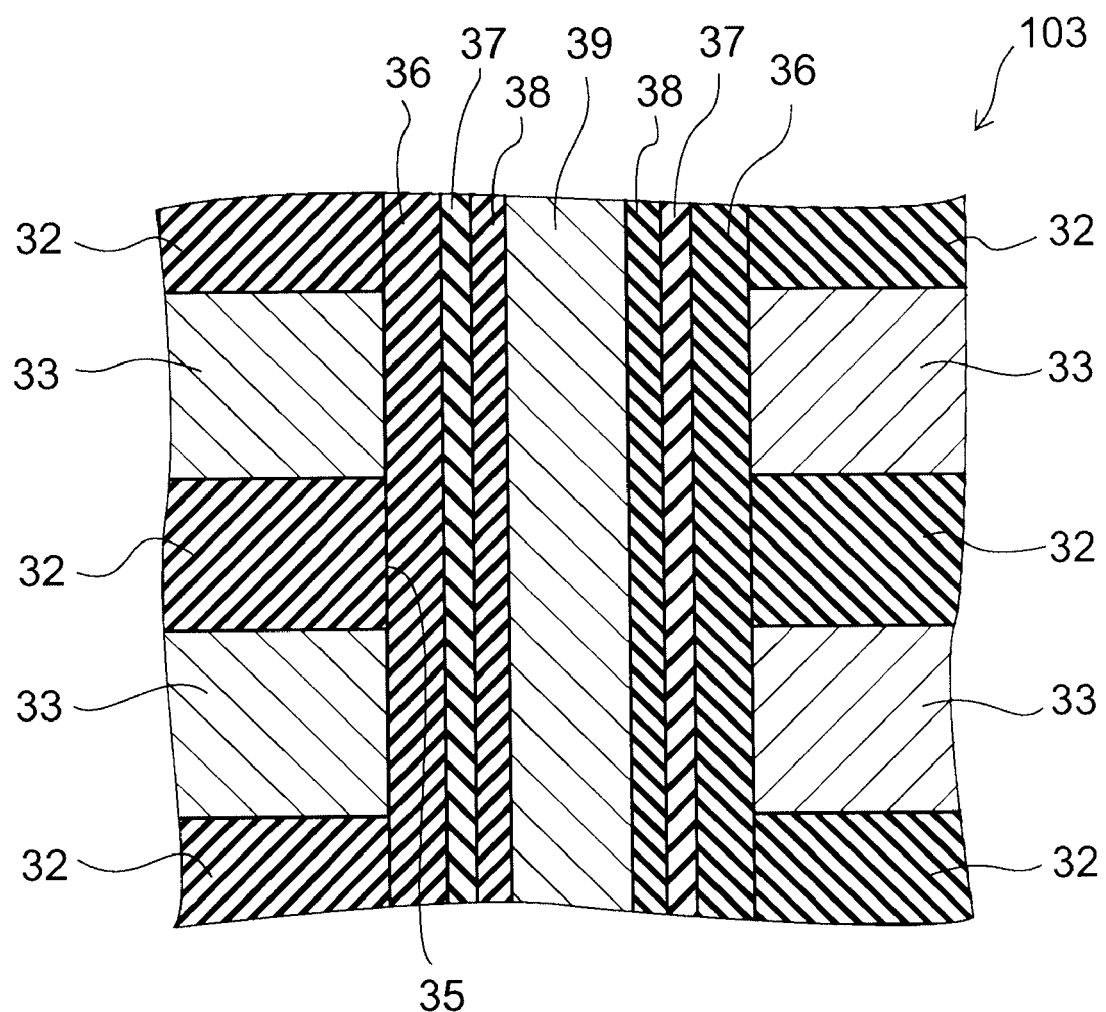
FIG. 20 is a cross-sectional view illustrating the nonvolatile semiconductor memory device according to the comparative example of the third embodiment.

FIG. 20 is a cross-sectional view illustrating the nonvolatile semiconductor memory device according to this comparative example.

As shown in FIGS. 19 and 20, the device 103 according to this comparative example is different from the device 3 (see FIGS. 13 and 14) according to the above third embodiment in that no cap layer 40 (see FIGS. 13 and 14) is provided. Hence, the erase threshold voltage tends to be saturated, and the memory window is difficult to expand. Furthermore, chemical reaction or mutual diffusion of elements occurs between the charge block layer 36 and the control gate electrode 33, causing variation in the characteristics of memory cells.

Next, a fourth embodiment of the invention is described.

Figure 21:
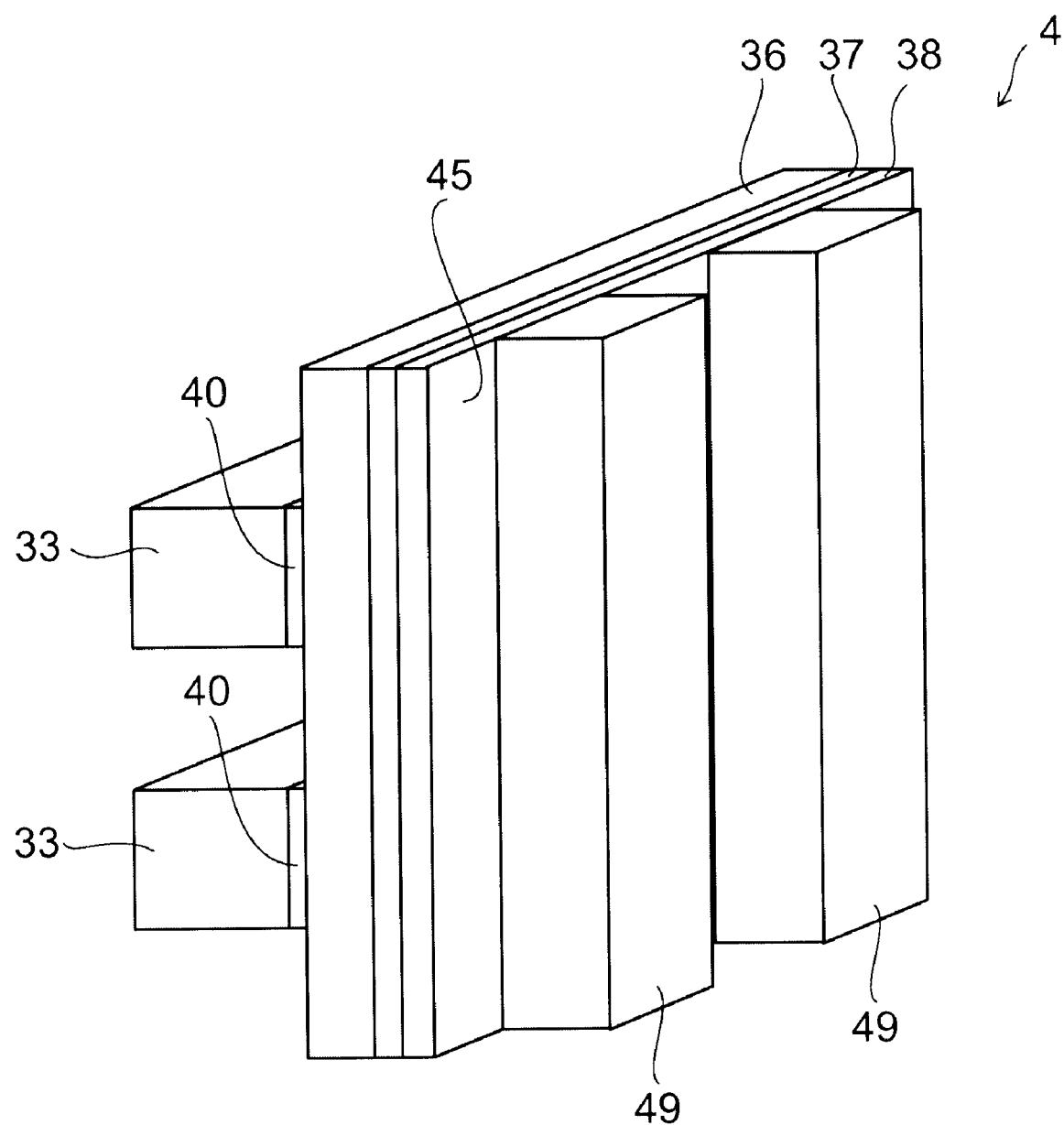
FIG. 21 is a perspective view illustrating a nonvolatile semiconductor memory device according to a fourth embodiment of the invention.

FIG. 21 is a perspective view illustrating a nonvolatile semiconductor memory device according to this embodiment.

Figure 22:
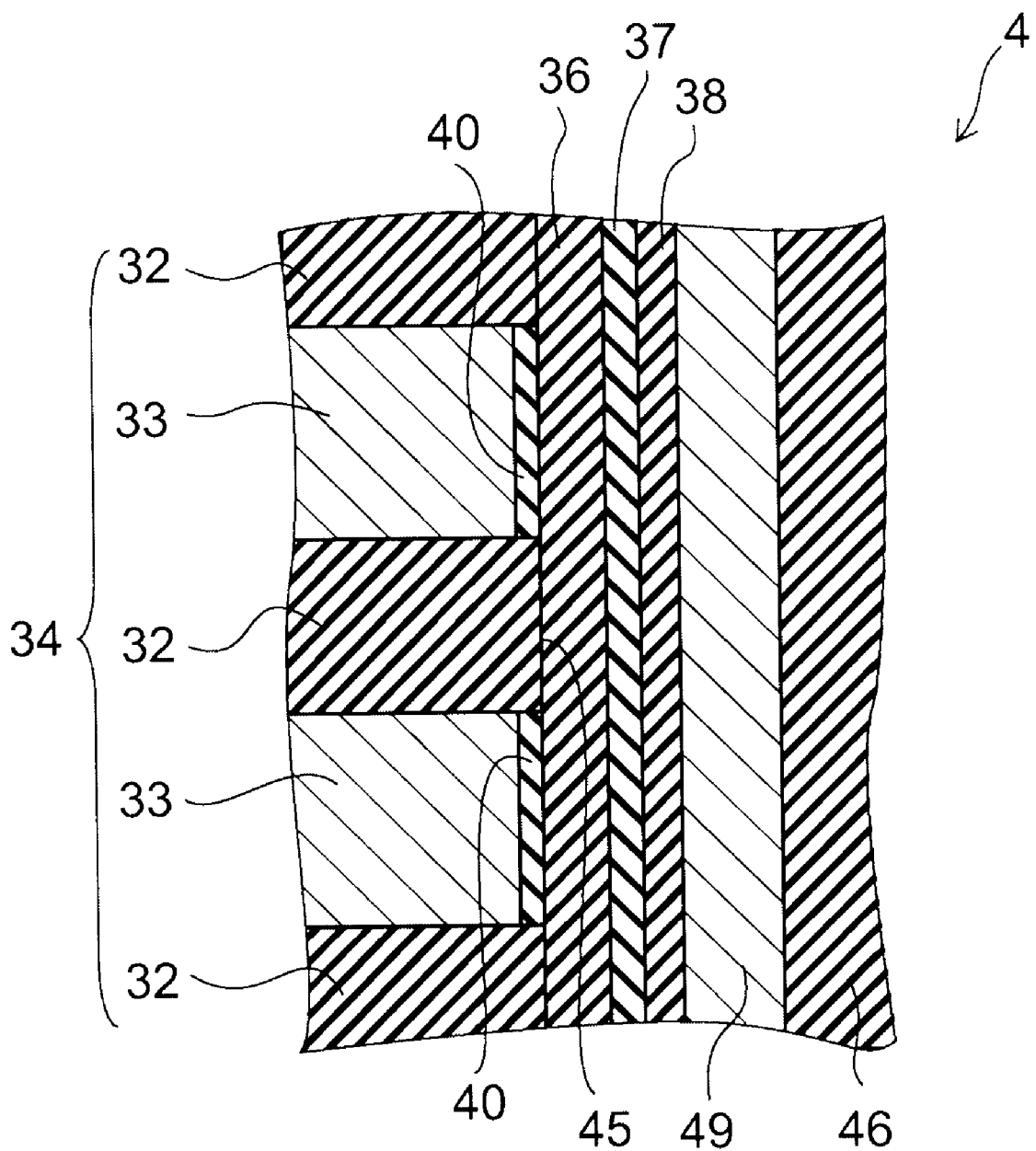
FIG. 22 is a cross-sectional view illustrating the nonvolatile semiconductor memory device according to the fourth embodiment.

FIG. 22 is a cross-sectional view illustrating the nonvolatile semiconductor memory device according to this embodiment.

In FIG. 21, the interelectrode insulating film and the device isolation insulating material are not shown.

In the following, components similar to those of the above third embodiment are labeled with like reference numerals, and the detailed description thereof is omitted.

As shown in FIGS. 21 and 22, in the nonvolatile semiconductor memory device 4 according to this embodiment, like the above third embodiment, a multilayer structure body 34 with interelectrode insulating films 32 and control gate electrodes 33 alternately stacked therein is formed on a semiconductor substrate 31 (see FIG. 23). The interelectrode insulating film 32 is illustratively made of silicon oxide, and the control gate electrode 33 is illustratively made of tungsten silicide. The thickness of the interelectrode insulating film 32 and the control gate electrode 33 is illustratively 50 nm each. That is, the channel length of the memory cell and the spacing between the adjacent memory cells in the device 4 are e.g. approximately 50 nm each.

This embodiment is different from the third embodiment in the shape of the trench and the silicon pillar formed in the multilayer structure body 34. More specifically, in the device 4, a stripe-shaped trench 45 extending in one direction is formed in the multilayer structure body 34. The lower end portion of the trench 45 does not reach the semiconductor substrate 31, but is located in the lowermost interelectrode insulating film 32. The trench 45 is formed in a plurality, and extends parallel to each other. A charge block layer 36, a charge storage layer 37, and a tunnel insulating layer 38 are stacked in this order on the inner surface of the trench 45.

Furthermore, a plurality of silicon pillars 49 are provided in each trench 45. The silicon pillars 49 are arranged so as to be spaced from each other along the extending direction of the trench 45. Each silicon pillar 49 has a U-shape formed from a quadrangular prismatic pillar bent twice at a right angle, and extends along one side surface of the trench 45, the bottom surface of the trench 45, and the other side surface of the trench 45 on the plane orthogonal to the extending direction of the trench 45. A device isolation insulating material 46 is buried in the space between the silicon pillars 49 in the trench 45. Thus, the device 4 functions as a NAND nonvolatile memory having a three-dimensional structure.

Furthermore, a cap layer 40 made of silicon nitride is formed between the charge block layer 36 and the control gate electrode 33. More specifically, as many cap layers 40 as the number of stages of the control gate electrodes 33 are provided on each of the two side surfaces of the trench 45, and extend in the extending direction of the trench 45.

Next, a method for manufacturing the nonvolatile semiconductor memory device 4 according to this embodiment is described.

FIGS. 23A and 23B to 26A and 26B are process views illustrating the method for manufacturing the nonvolatile semiconductor memory device according to this embodiment, where the figures with the suffix A show a cross section in the channel length direction, and the figures with the suffix B show a plan view.

Figure 23A:
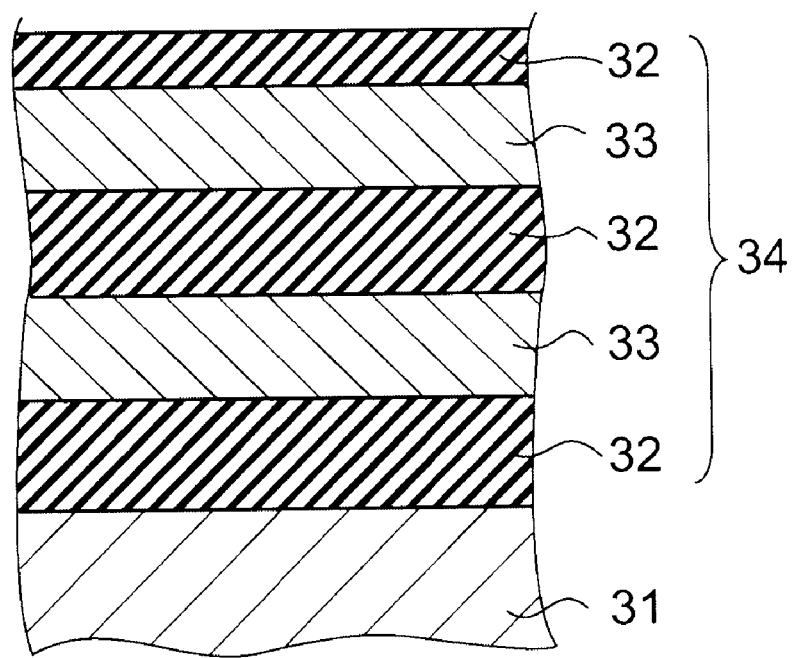
Figure 23B:
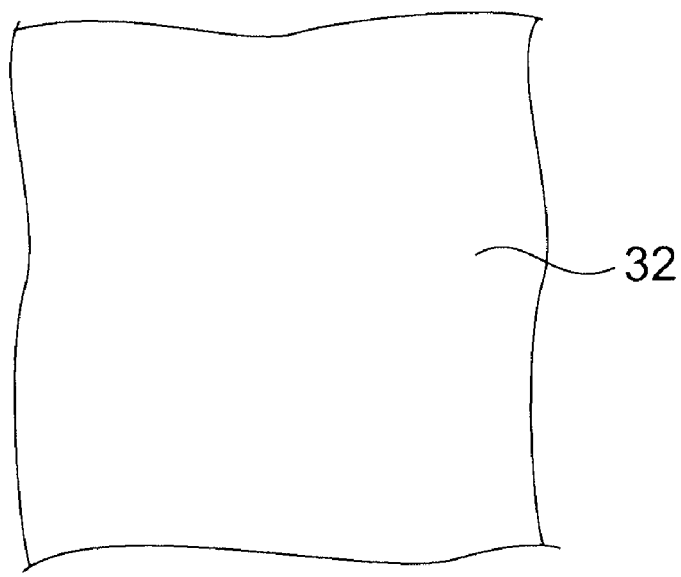

First, as shown in FIGS. 23A and 23B, on a semiconductor substrate 31, by the CVD, sputtering, or other process, an interelectrode insulating film 32 illustratively made of silicon oxide and a control gate electrode 33 made of tungsten silicide are alternately and repetitively stacked to form a multilayer structure body 34. The thickness of the interelectrode insulating film 32 and the control gate electrode 33 is illustratively 50 nm each.

Figure 24A:
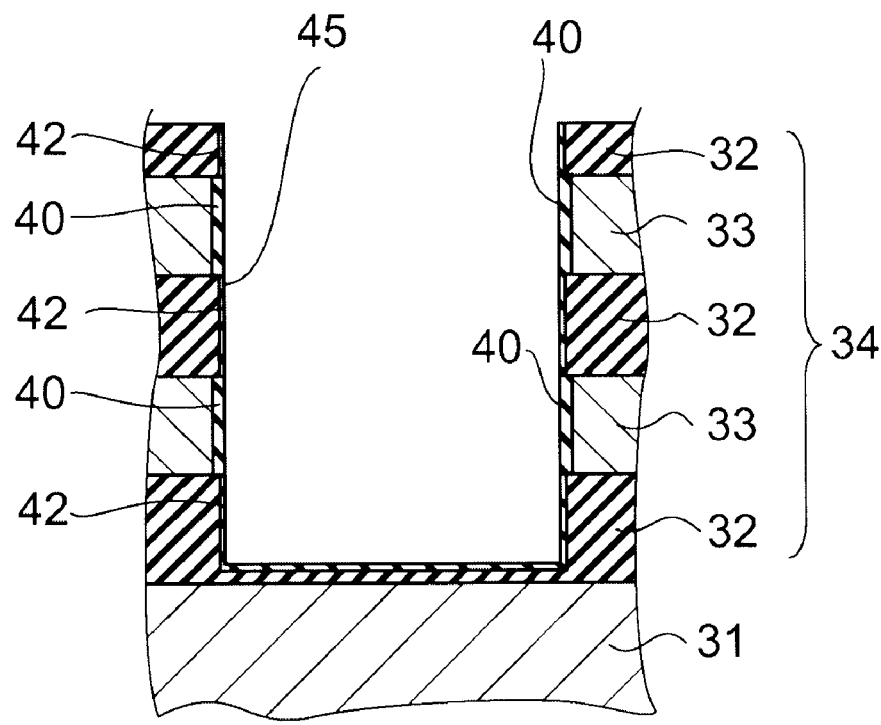
Figure 24B:
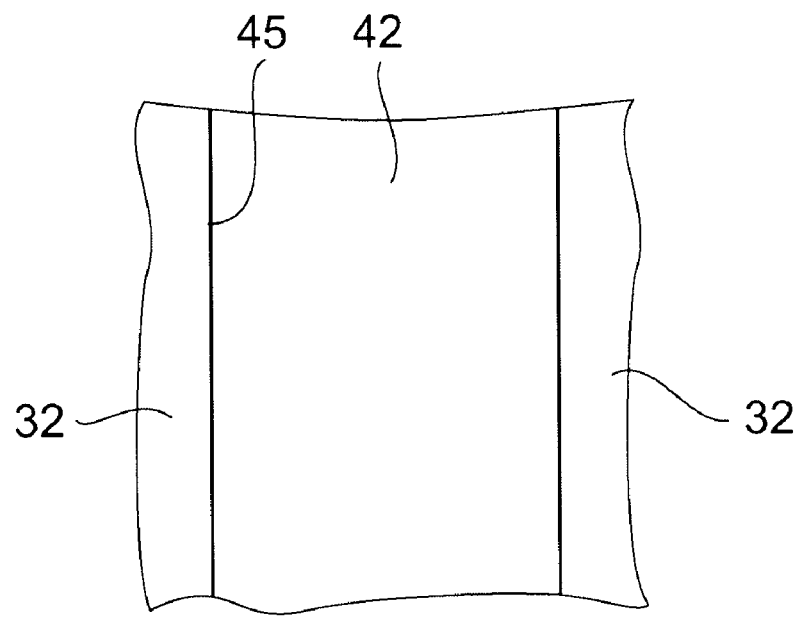

Next, as shown in FIGS. 24A and 24B, by the RIE or other process, a trench 45 reaching the inside of the lowermost interelectrode insulating film 32 is formed in the multilayer structure body 34. The trench 45 is illustratively shaped like a stripe extending in one direction parallel to the upper surface of the semiconductor substrate 31. The trench 45 is formed in a plurality, and arranged parallel to each other. At this time, the interelectrode insulating films 32 and the control gate electrodes 33 are exposed to the side surface of the trench 45. Furthermore, the lowermost interelectrode insulating film 32 is exposed to the bottom surface of the trench 45.

Next, in a chamber illustratively maintained at a pressure approximately from 30 Pa to 1 kPa, a raw material gas primarily composed of nitrogen gas is excited into a plasma by microwaves, RF waves, electron cyclotron resonance or the like to form a plasma atmosphere containing electrically neutral nitrogen radicals at high density. Here, the density of neutral nitrogen radicals is in the range from $1\times10^9$ cm$^{-3}$ to $1\times10^{16}$ cm$^{-3}$, and more preferably in the range from $1\times10^{11}$ cm$^{-3}$ to $1\times10^{14}$ cm$^{-3}$, and it is illustratively set to $1\times10^{12}$ cm$^{-3}$ to $1\times10^{13}$ cm$^{-3}$. The reason for setting the density of nitrogen radicals to the aforementioned range is the same as that for the above third embodiment.

Thus, the nitrogen radicals are introduced into the trench 45 and nitridize the inner surface of the trench 45. Here, at the inner surface of the trench 45, the control gate electrode 33 is selectively nitridized relative to the interelectrode insulating film 32. Consequently, a silicon nitride layer having a thickness of approximately 1 nm is formed at the exposed surface of the control gate electrode 33, and serves as a cap layer 40. On the other hand, a silicon oxynitride layer 42 having a thickness of approximately 0.5 nm is formed at the exposed surface of the interelectrode insulating film 32.

Figure 25A:
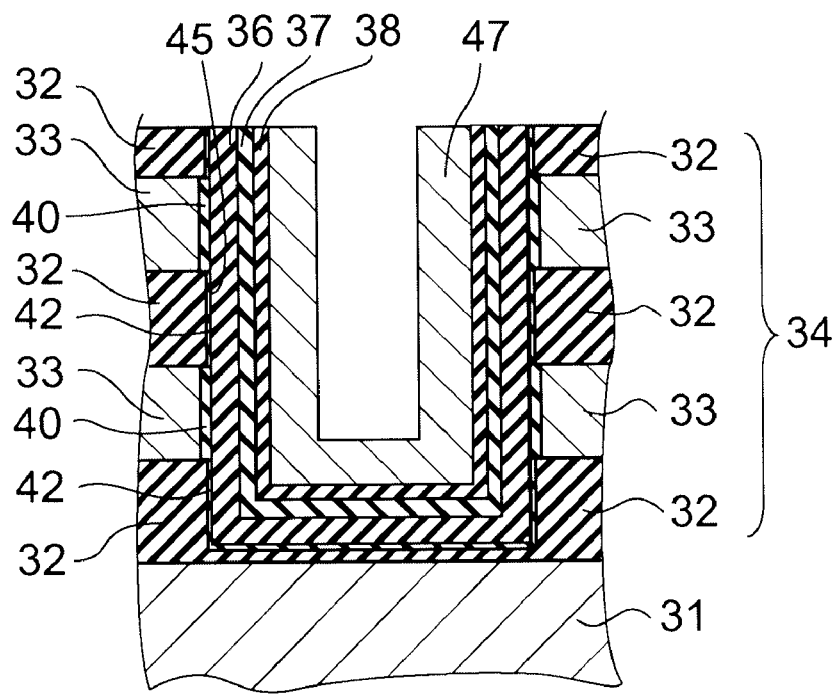
Figure 25B:
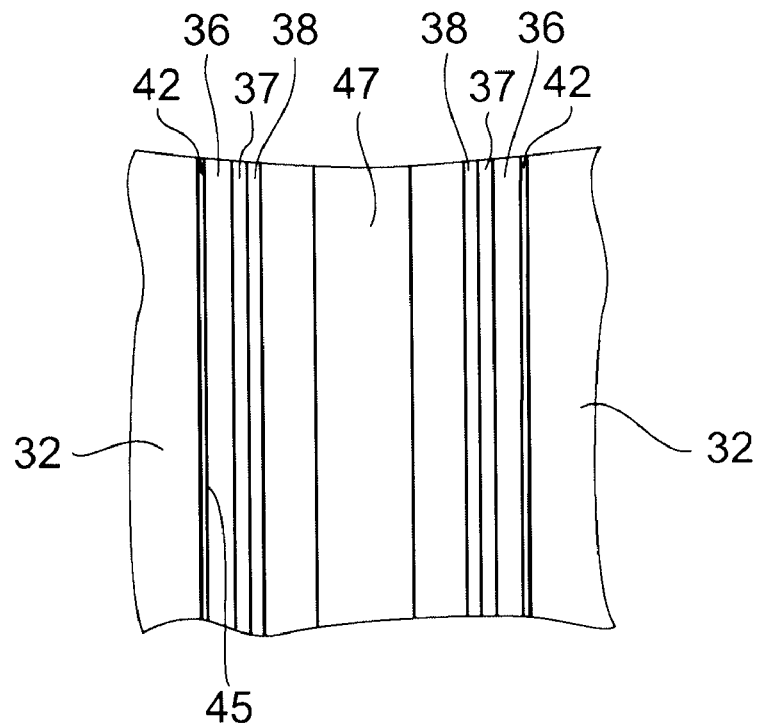

Next, as shown in FIGS. 25A and 25B, on the inner surface of the trench 45, a charge block layer 36 made of silicon oxide and having a thickness of approximately 10 to 20 nm is formed. Here, by using the atomic layer deposition (ALD) process, the charge block layer 36 can be formed nearly uniformly on the inner surface of the trench 45. Furthermore, when the silicon oxide is formed, the silicon oxynitride layer 42 is oxidized, and the nitrogen content therein becomes 10% or less. Subsequently, a charge storage layer 37 illustratively made of silicon nitride and having a thickness of approximately 2 to 5 nm is formed illustratively by the ALD process. Subsequently, a tunnel insulating layer 38 illustratively made of silicon oxide and having a thickness of approximately 5 to 10 nm is formed illustratively by the ALD process.

Next, by the CVD or other process, an amorphous silicon layer containing n-type impurities is formed on the tunnel insulating layer 38. Next, by annealing at a temperature of approximately 500 to 600° C., this amorphous silicon layer is crystallized into a crystal silicon layer 47. Thus, a crystal silicon layer 47 with few crystal defects can be formed. Next, the crystal silicon layer 47, the tunnel insulating layer 38, the charge storage layer 37, and the charge block layer 36 formed on the multilayer structure body 34 are removed by the CMP or other process.

Figure 26A:
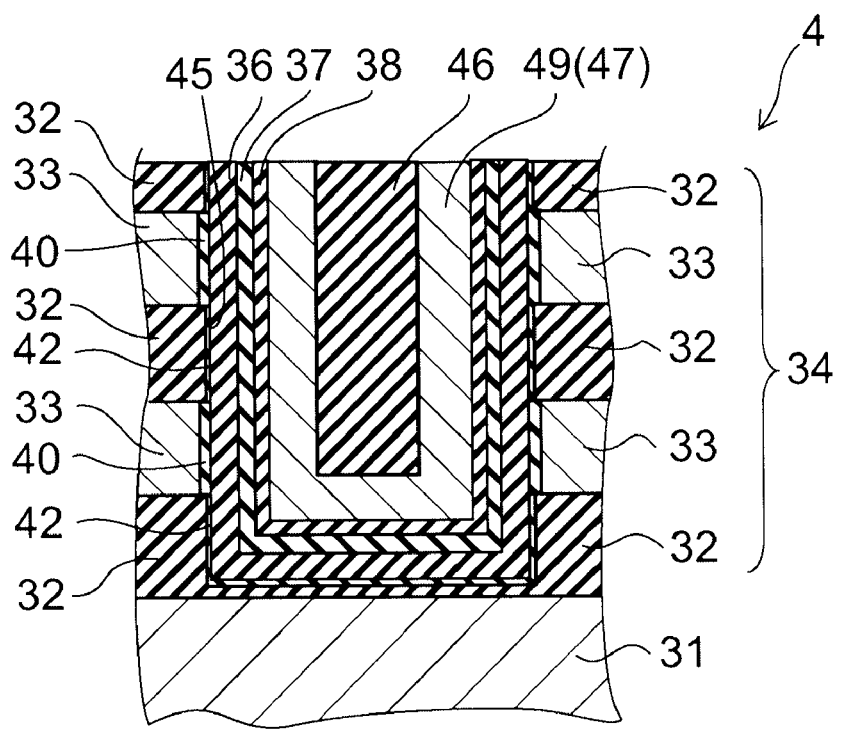
Figure 26B:
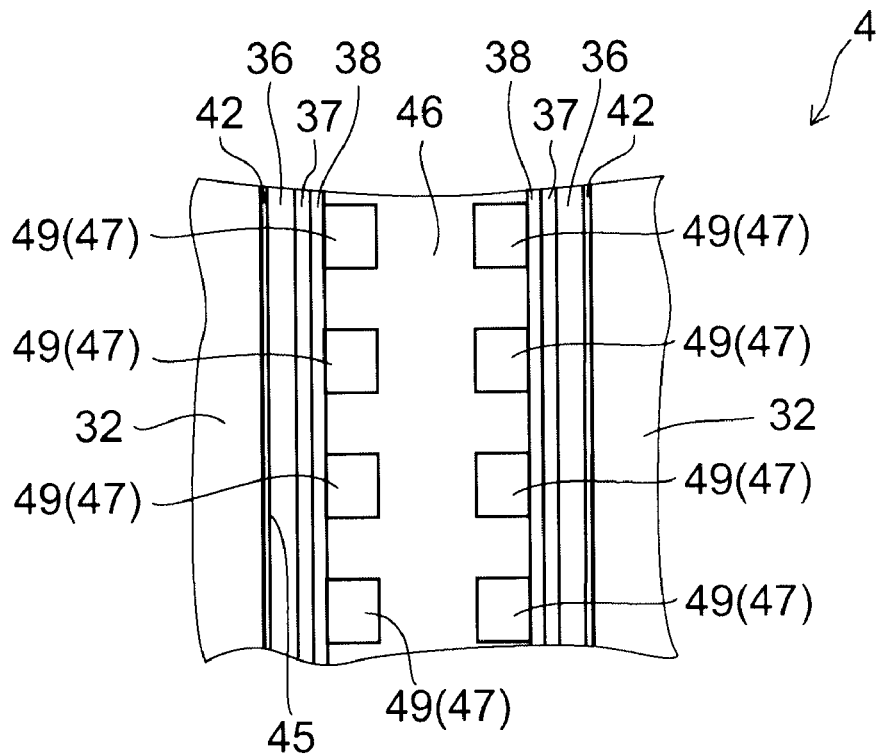

Next, as shown in FIGS. 26A and 26B, by the RIE or other process, the crystal silicon layer 47 is selectively removed and divided along the extending direction of the trench 45. Thus, a plurality of U-shaped silicon pillars 49 are formed. This silicon pillar 49 serves as a channel semiconductor of the device 4.

Next, a device isolation insulating material 46 is buried in the trench 45 by the CVD, coating, or other process. The device isolation insulating material 46 is illustratively silicon oxide. Thus, the silicon pillars 49 formed in the trench 45 are insulated from each other by the device isolation insulating material 46. Subsequently, a MONOS type nonvolatile memory having a three-dimensional structure is completed using conventional techniques. Thus, the device 4 is manufactured.

Next, the function and effect of this embodiment are described.

Also in this embodiment, like the above third embodiment, a cap layer 40 made of silicon nitride is formed between the charge block layer 36 and the control gate electrode 33. Hence, saturation of the erase threshold voltage is prevented, and the memory window can be expanded. Furthermore, chemical reaction and mutual diffusion of elements between the charge block layer 36 and the control gate electrode 33 can be prevented. Furthermore, the cap layer 40 is divided for each control gate electrode 33, and hence does not affect the operation of the memory cell.

In this embodiment described above, a U-shaped silicon pillar 49 electrically insulated from the semiconductor substrate 31 is used as a channel layer. However, the invention is not limited thereto. For instance, a prismatic semiconductor pillar electrically connected to the semiconductor substrate can also be used as a channel layer.

Next, a comparative example of this embodiment is described.

Figure 27:
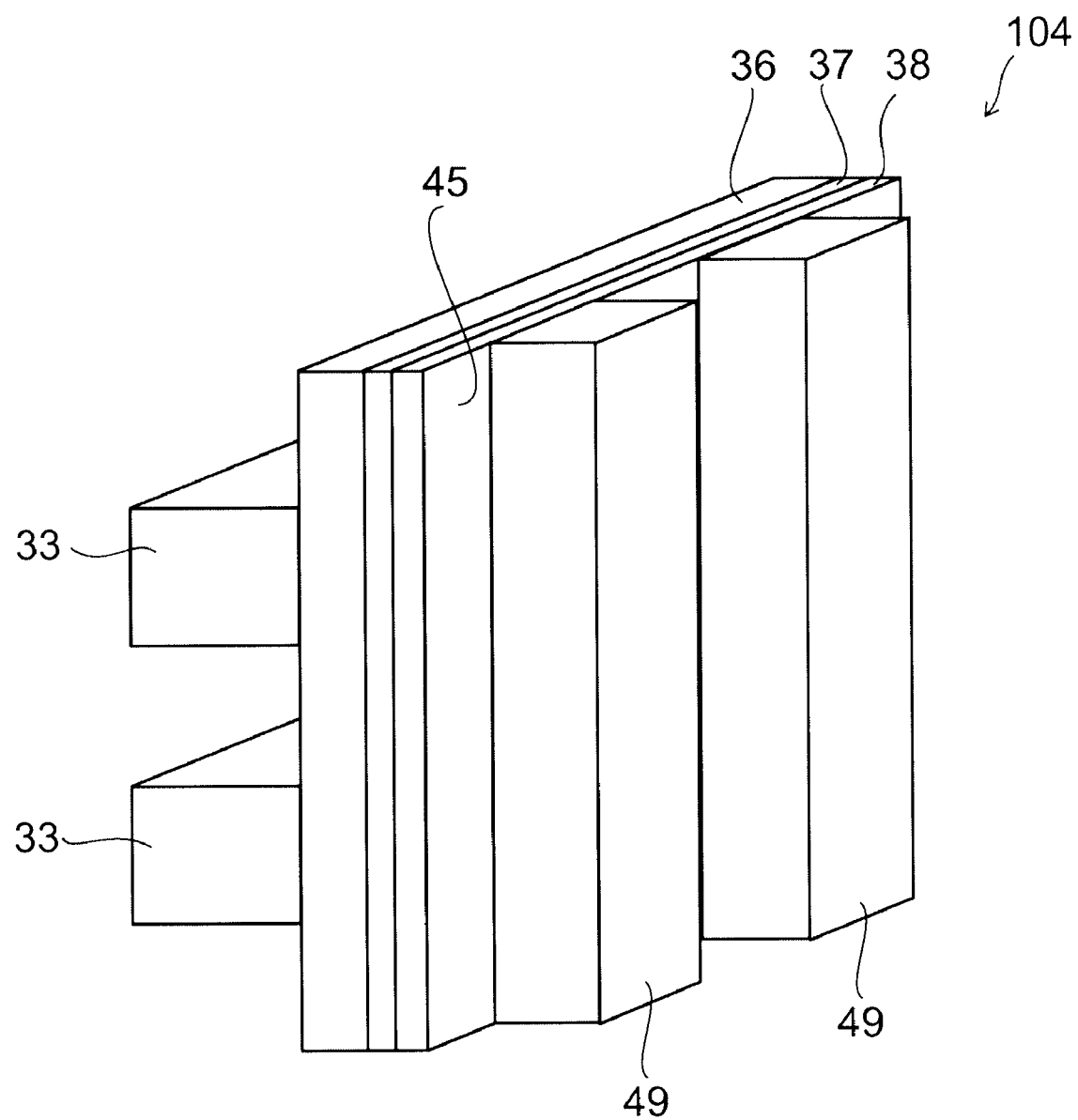
FIG. 27 is a perspective view illustrating a nonvolatile semiconductor memory device according to a comparative example of the fourth embodiment.

FIG. 27 is a perspective view illustrating a nonvolatile semiconductor memory device according to this comparative example.

Figure 28:
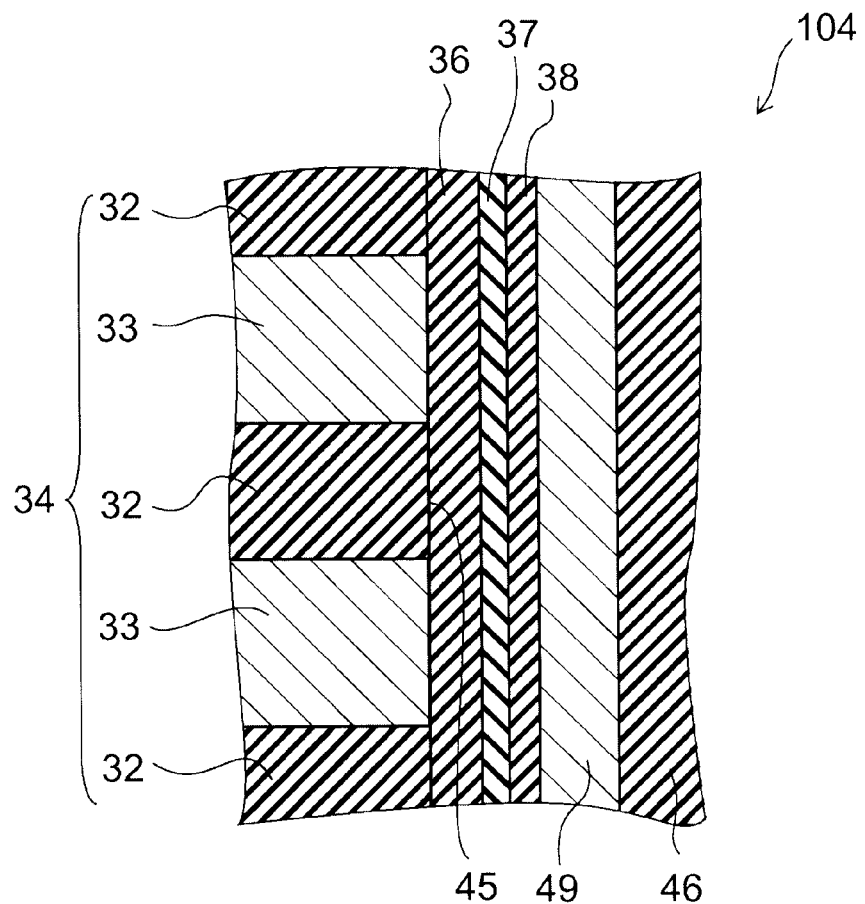
FIG. 28 is a cross-sectional view illustrating the nonvolatile semiconductor memory device according to the comparative example of the fourth embodiment.

FIG. 28 is a cross-sectional view illustrating the nonvolatile semiconductor memory device according to this comparative example.

As shown in FIGS. 27 and 28, the device 104 according to this comparative example is different from the device 4 (see FIGS. 21 and 22) according to the above fourth embodiment in that no cap layer 40 (see FIGS. 21 and 22) is provided. Hence, the erase threshold voltage tends to be saturated, and the memory window is difficult to expand. Furthermore, chemical reaction or mutual diffusion of elements occurs between the charge block layer 36 and the control gate electrode 33, causing variation in the characteristics of memory cells.

Next, a fifth embodiment of the invention is described.

Figure 29:
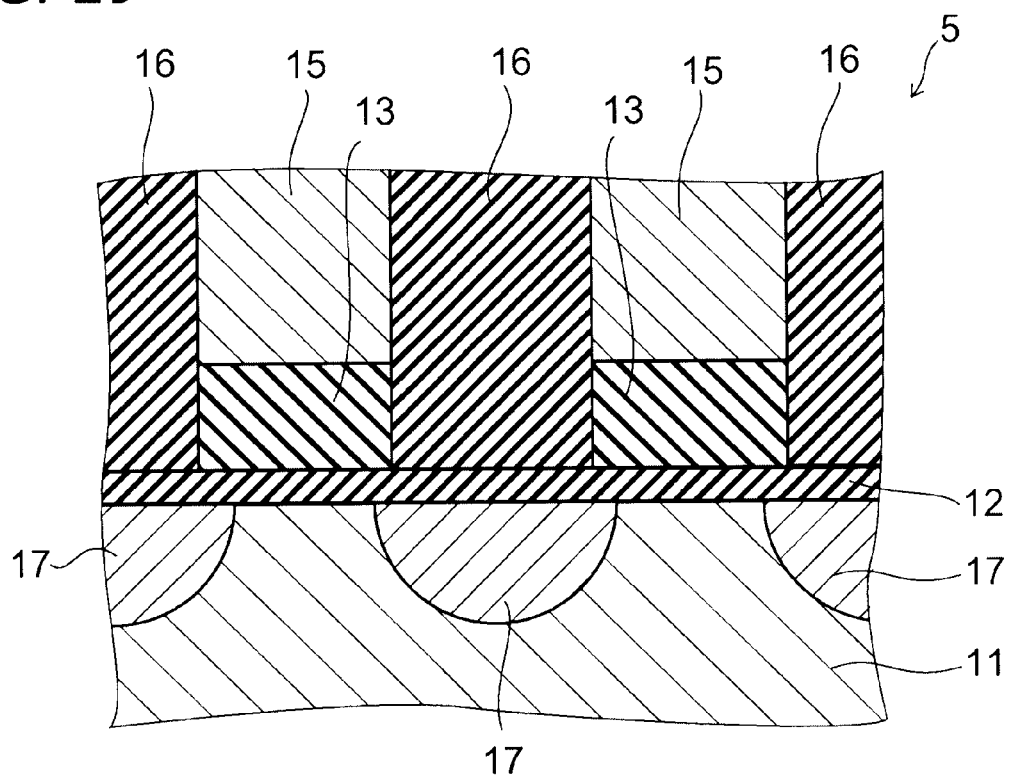
FIG. 29 is a cross-sectional view illustrating a nonvolatile semiconductor memory device according to a fifth embodiment of the invention.

FIG. 29 is a cross-sectional view illustrating a nonvolatile semiconductor memory device according to this embodiment.

Here, FIG. 29 shows two memory cells in a cross section parallel to the bit line direction (channel length direction).

As shown in FIG. 29, the nonvolatile semiconductor memory device 5 according to this embodiment is a charge trap type memory device like the device 1 (see FIG. 1) according to the above first embodiment. More specifically, the device 5 includes a NAND type memory cell array in which a plurality of MNOS type memory cells are series connected in the extending direction of bit lines (channel length direction).

The device 5 includes, like the device 1, a silicon substrate 11 illustratively made of single crystal silicon having p-type conductivity, and an impurity diffusion region 17 having n-type conductivity is formed in a plurality of regions in an upper portion of the silicon substrate 11. On the silicon substrate 11, a tunnel insulating layer 12 illustratively made of silicon oxide is provided, and a charge storage layer 13 made of silicon nitride and including charge trap states is provided thereon. Furthermore, a plurality of control gate electrodes 15 are provided on the charge storage layer 13. The control gate electrodes 15 are arranged so as to be spaced from each other along the channel length direction. An interelectrode insulating film 16 is provided between the control gate electrodes 15. The width of the control gate electrode 15 and the distance between the control gate electrodes 15 in the channel length direction are illustratively 50 nm each.

However, in contrast to the device 1, the device 5 includes no charge block layer 14 (see FIG. 1), but the charge storage layer 13 is in contact with the control gate electrode 15. Furthermore, the charge storage layer 13 is divided for each control gate electrode 15, and the interelectrode insulating film is interposed between the charge storage layers 13. Furthermore, the device 5 includes no cap layer 20 (see FIG. 1). The method for manufacturing the device 5 according to this embodiment is similar to that for the device 1 (see FIGS. 1 to 7) according to the above first embodiment.

Next, the function and effect of this embodiment are described.

In this embodiment, the charge storage layers 13 made of silicon nitride are separated between the adjacent control gate electrodes 15. This can prevent the charge trapped in the charge storage layer 13 from being moved toward the adjacent memory cell by the self-electric field or the potential difference relative to the adjacent memory cell. Thus, the data retention characteristics of the memory cell are improved. This effect is remarkable particularly in a microscale device. Here, separation of the charge storage layers 13 may be incomplete. For instance, migration of the trapped charge can be prevented also in the case where the portion of the charge storage layer 13 located immediately below the region between the control gate electrodes 15 is formed from a silicon oxynitride having a lower nitrogen content than the portion located immediately below the control gate electrode 15.

For instance, for a memory cell spacing of 30 nm or more, the aforementioned problems are substantially negligible if the nitrogen content in the portion of the charge storage layer 13 located immediately below the region between the control gate electrodes is 1/3 or less of the nitrogen content in the portion located immediately below the control gate electrode.

Next, a comparative example of this embodiment is described.

Figure 30:
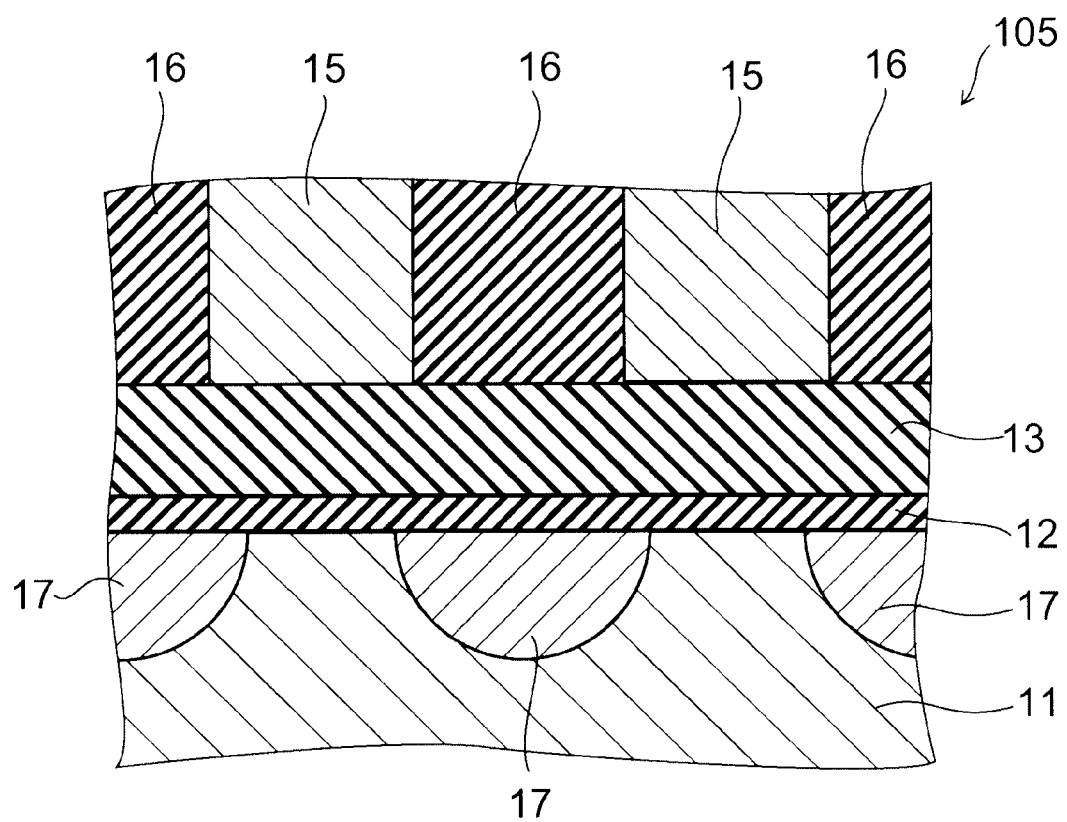
FIG. 30 is a cross-sectional view illustrating a nonvolatile semiconductor memory device according to a comparative example of the fifth embodiment.

FIG. 30 is a cross-sectional view illustrating a nonvolatile semiconductor memory device according to this comparative example.

As shown in FIG. 30, the nonvolatile semiconductor memory device 105 according to this comparative example is different from the device 5 (see FIG. 29) according to the above fifth embodiment in that the charge storage layer 13 is provided continuously along the channel length direction. That is, the charge storage layer 13 is present also between the tunnel insulating layer 12 and the interelectrode insulating film 16.

In the device 105 according to this comparative example, the charge storage layer 13 is formed continuously along the channel length direction. Hence, when a high potential difference is applied between the silicon substrate 11 and the control gate electrode 15 to cause the charge storage layer 13 to trap charge for memory operation, the trapped charge is moved in the charge storage layer 13 toward the adjacent memory cell by the self-electric field or the potential difference relative to the adjacent memory cell. Thus, the memory cell has poor data retention characteristics.

Next, a sixth embodiment of the invention is described.

Figure 31:
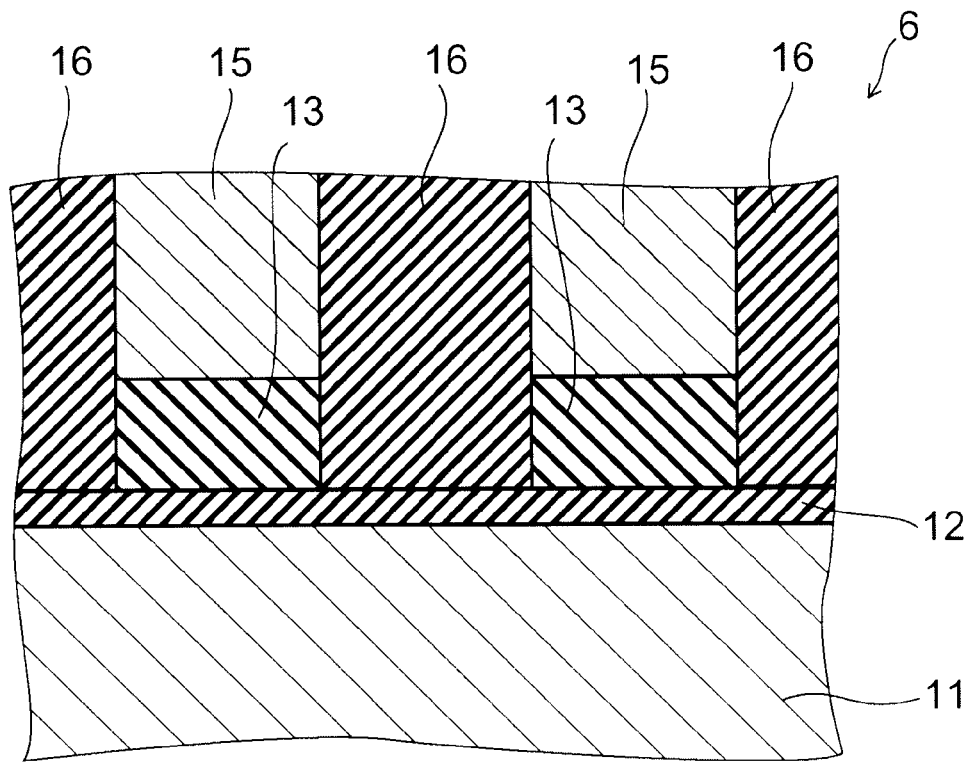
FIG. 31 is a cross-sectional view illustrating a nonvolatile semiconductor memory device according to a sixth embodiment of the invention.

FIG. 31 is a cross-sectional view illustrating a nonvolatile semiconductor memory device according to this embodiment.

Here, FIG. 31 shows two memory cells in a cross section parallel to the bit line direction (channel length direction).

As shown in FIG. 31, the nonvolatile semiconductor memory device 6 according to this embodiment is different from the device 5 (see FIG. 29) according to the above fifth embodiment in that the silicon substrate 11 has n-type conductivity and that no impurity diffusion region 17 (see FIG. 29) is formed therein. That is, the memory cell of this embodiment is a MNOS type memory cell using a depression type cell transistor.

Next, a method for manufacturing the nonvolatile semiconductor memory device 6 according to this embodiment is described.

FIGS. 32A and 32B to 35A and 35B are process views illustrating the method for manufacturing the nonvolatile semiconductor memory device according to this embodiment, where the figures with the suffix A show a cross section in the channel length direction, and the figures with the suffix B show a plan view.

In the following, a description is given of a method for manufacturing the device according to this embodiment where the channel length direction is perpendicular to the upper surface of the semiconductor substrate.

Figure 32A:
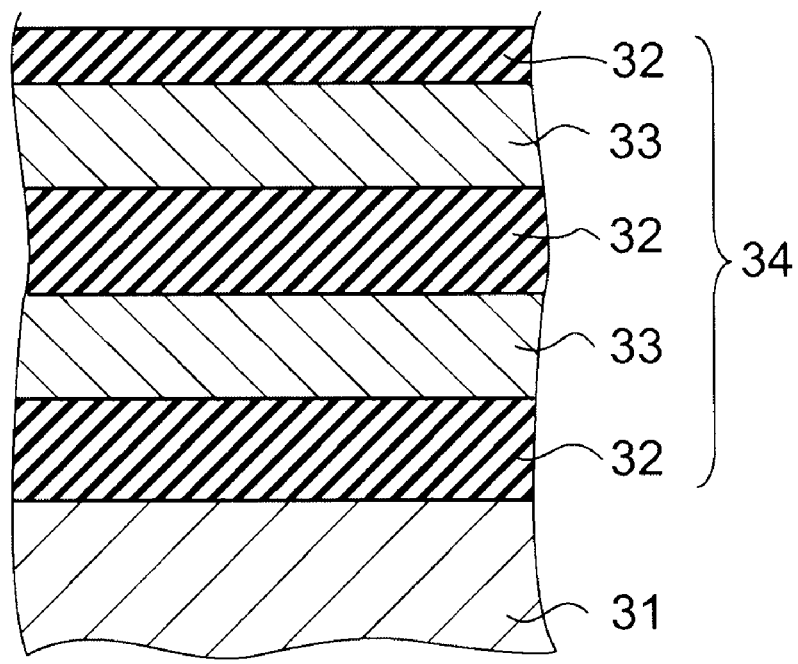
Figure 32B:
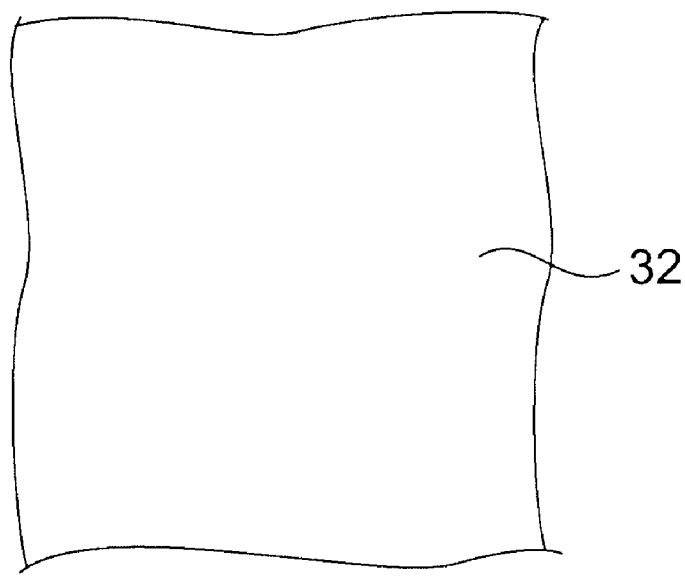

First, as shown in FIGS. 32A and 32B, on a semiconductor substrate 31, which is a single crystal silicon substrate, by the CVD or other process, an interelectrode insulating film 32 illustratively made of silicon oxide and a control gate electrode 33 illustratively made of silicon containing dopants at high concentration are alternately and repetitively stacked to form a multilayer structure body 34.

Figure 33A:
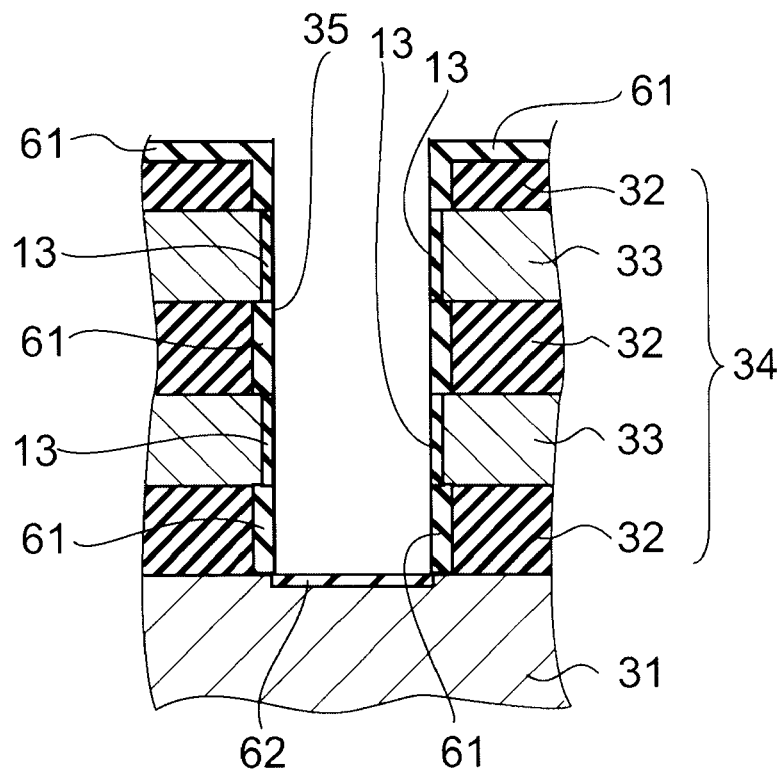
Figure 33B:
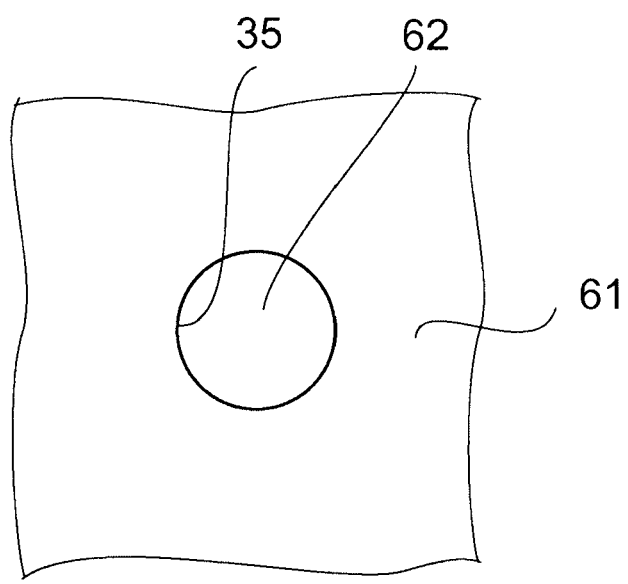

Next, as shown in FIGS. 33A and 33B, by the RIE or other process, a hole-shaped trench 35 reaching the semiconductor substrate 31 is formed in the multilayer structure body 34. The trench 35 is illustratively shaped like a cylinder extending in the stacking direction of the multilayer structure body 34. At this time, the interelectrode insulating films 32 and the control gate electrodes 33 are exposed to the side surface of the trench 35. Furthermore, the semiconductor substrate 31 is exposed to the bottom surface of the trench 35. The trench 35 is formed in a plurality, and illustratively formed in a matrix as viewed from above.

Next, thermal nitridation is performed at a temperature of approximately 900 to 1100° C. in a nitridizing atmosphere, such as ammonia gas, to form a nitride layer at the inner surface of the trench 35. Subsequently, thermal oxidation is performed at a temperature of approximately 700 to 1000° C. in an oxidizing atmosphere, such as water vapor, to selectively eliminate the nitrogen element from the nitride layer formed at the exposed surface of the interelectrode insulating film 32 and turn it into an oxynitride layer having a lower nitrogen content than the nitride layer formed at the exposed surface of the control gate electrode 33. Thus, a silicon nitride layer having a thickness of e.g. approximately 7 nm is formed on the exposed surface of the control gate electrode 33 made of doped silicon, and serves as a charge storage layer 13. On the other hand, a silicon oxynitride layer 61 having a thickness of approximately 10 nm and an average nitrogen content of 10% or less is formed on the exposed surface of the interelectrode insulating film 32 made of silicon oxide. Furthermore, at this time, a nitride layer 62 is formed on the exposed surface of the semiconductor substrate 31.

Alternatively, the above nitridation process can be performed by radical nitridation at a temperature of approximately 400 to 800° C. in a nitridizing radical atmosphere, such as nitrogen radicals. Furthermore, the above nitrogen elimination process can also be performed as follows. The interelectrode insulating film 32 is formed from a silicon oxide film having low density and high hygroscopicity by the coating or other process, and annealed at a temperature of approximately 700 to 1000° C. so that water vapor desorbed from the interelectrode insulating film 32 can be used for oxidation reaction.

Figure 34A:
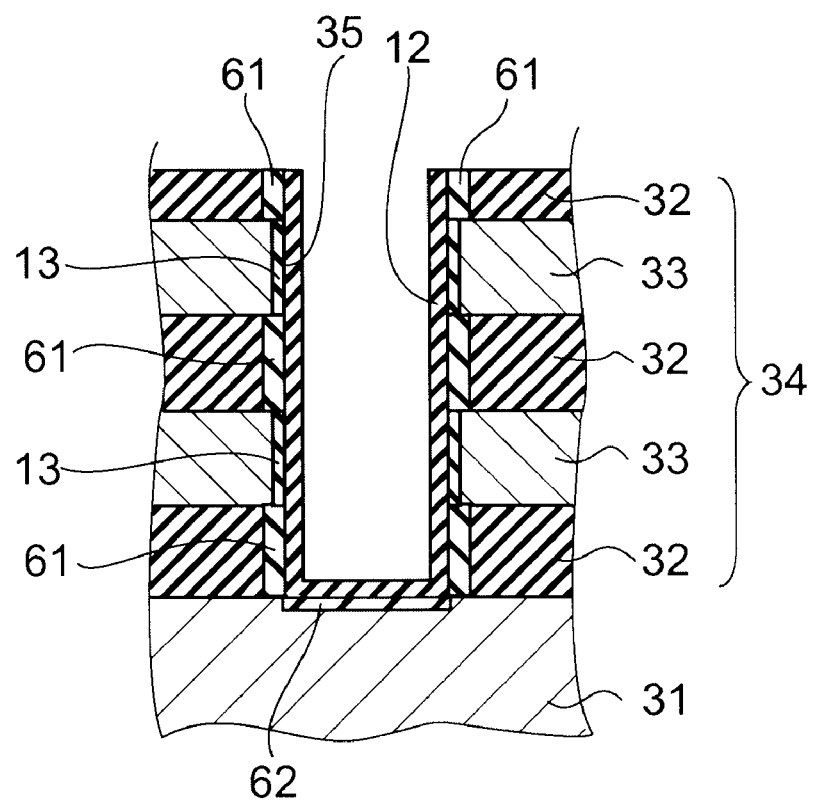
Figure 34B:
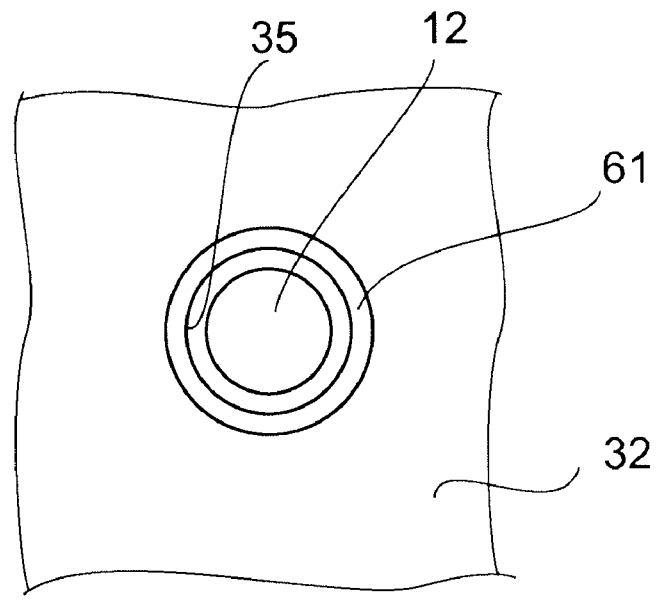

Next, as shown in FIGS. 34A and 34B, by the ALD or other process, a tunnel insulating layer 12 illustratively made of silicon oxide and having a thickness of approximately 2 to 5 nm is formed on the inner surface of the trench 35. At this time, the silicon oxynitride layer 61 is further oxidized, and the nitrogen content in the surface portion thereof also becomes 10% or less. Subsequently, by the CMP or other process, the tunnel insulating layer 12 and the silicon oxynitride layer 61 formed on the multilayer structure body 34 are removed.

Figure 35A:
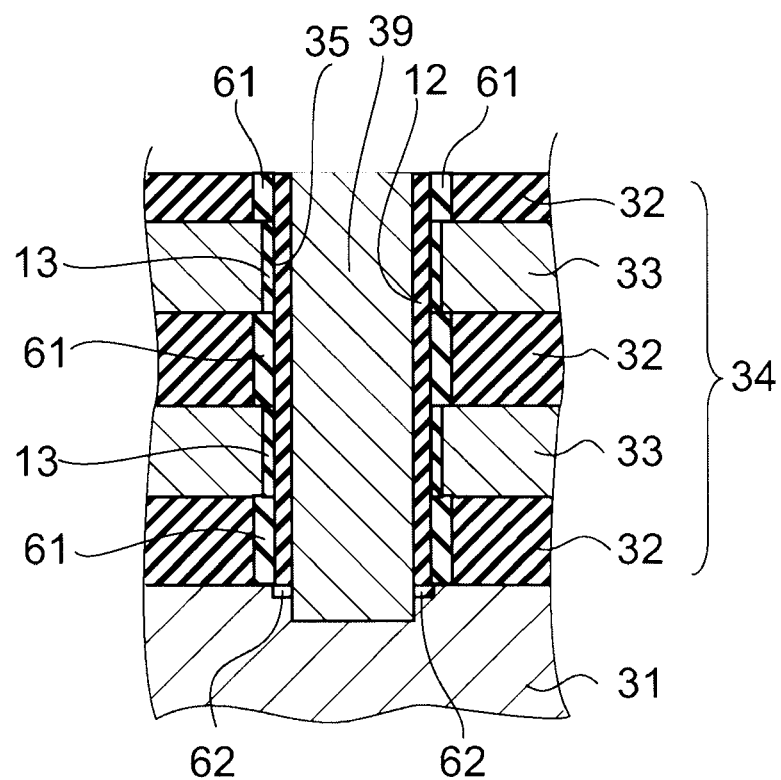
Figure 35B:
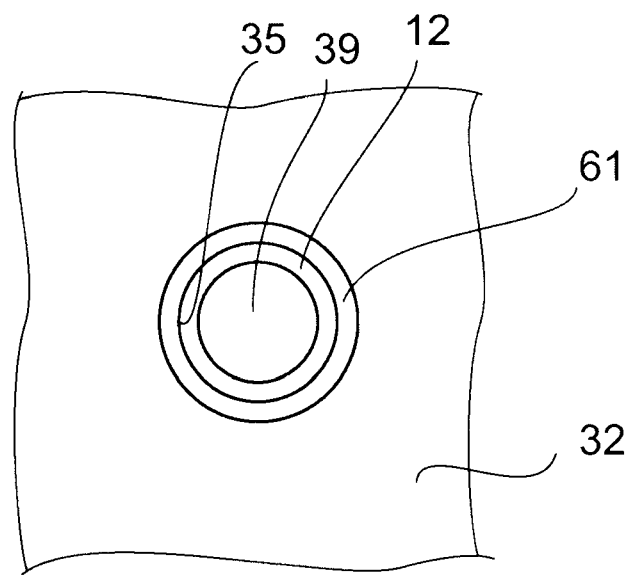

Next, as shown in FIGS. 35A and 35B, by the RIE or other process, the tunnel insulating layer 12 and the nitride layer 62 formed on the bottom surface of the trench 35 are removed. Furthermore, the semiconductor substrate 31 is dug down slightly in the upper surface and exposed. Subsequently, by the CVD or other process, amorphous silicon containing n-type impurities to constitute a channel semiconductor layer is buried inside the trench 35. Next, by annealing at a temperature of approximately 500 to 600° C., the amorphous silicon is crystallized starting at the surface in contact with the semiconductor substrate 31. Thus, a silicon pillar 39 made of crystalline silicon can be formed. This crystalline silicon includes few crystal defects because its crystallinity is inherited from the crystallinity of the semiconductor substrate 31, and has high conductivity because it contains n-type impurities. Subsequently, a MNOS type nonvolatile memory having a three-dimensional structure is completed using conventional techniques. Thus, the device 6 is manufactured.

The function and effect of this embodiment are the same as those of the above fifth embodiment.

In this embodiment described above, a cylindrical silicon pillar 39 electrically connected to the semiconductor substrate 31 is used as a channel layer. However, the invention is not limited thereto. For instance, a U-shaped semiconductor pillar electrically insulated from the semiconductor substrate can also be used as a channel layer.

Next, a comparative example of this embodiment is described.

Figure 36:
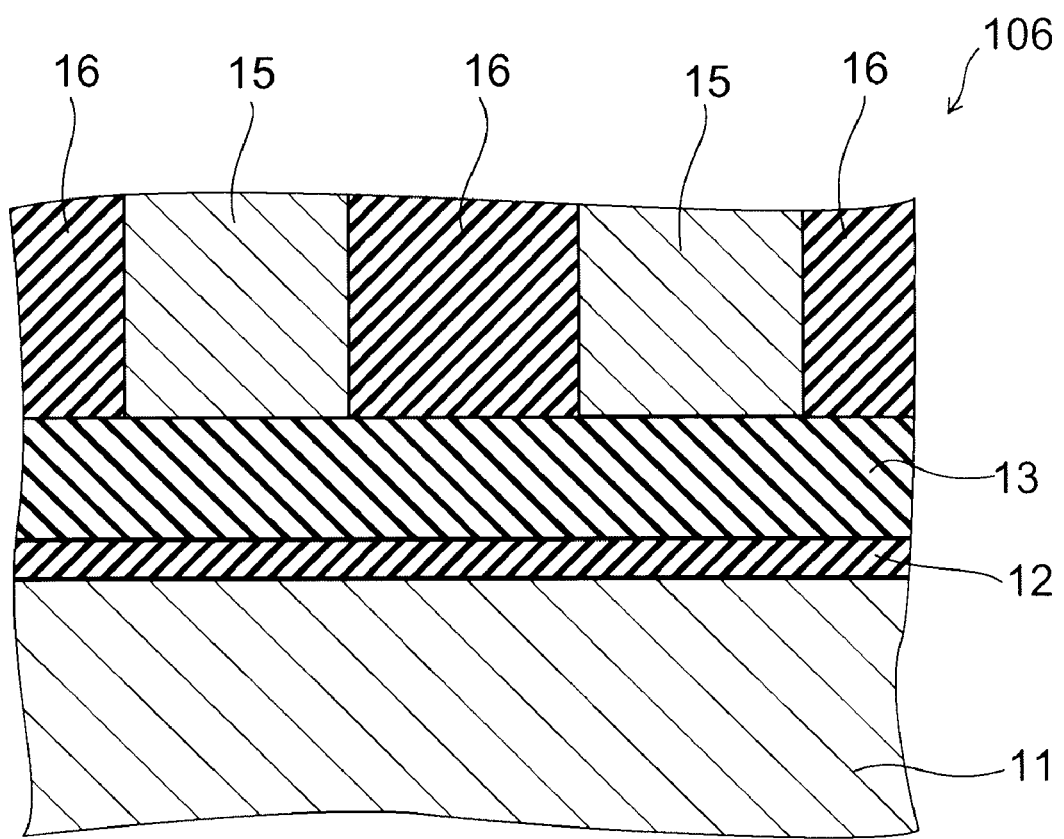
FIG. 36 is a cross-sectional view illustrating a nonvolatile semiconductor memory device according to a comparative example of the sixth embodiment.

FIG. 36 is a cross-sectional view illustrating a nonvolatile semiconductor memory device according to this comparative example.

As shown in FIG. 36, the nonvolatile semiconductor memory device 106 according to this comparative example is different from the device 6 (see FIG. 31) according to the above sixth embodiment in that the charge storage layer 13 is provided continuously along the channel length direction. That is, the charge storage layer 13 is present also between the tunnel insulating layer 12 and the interelectrode insulating film 16.

In the device 106 according to this comparative example, the charge storage layer 13 is continuously formed between the control gate electrodes 15. Hence, the charge trapped in the charge storage layer 13 is moved toward the adjacent memory cell by the self-electric field or the potential difference relative to the adjacent memory cell. Thus, in this comparative example, the memory cell has poor data retention characteristics.

The invention has been described with reference to the embodiments. However, the invention is not limited to these embodiments. Those skilled in the art can suitably modify the above embodiments by addition, deletion, or design change of components, or by addition, omission, or condition change of processes, and such modifications are also encompassed within the scope of the invention as long as they fall within the spirit of the invention. For instance, in the above embodiments, the MONOS type memory cell can be replaced by a MNOS type memory cell. Furthermore, the above embodiments can be practiced in combination with each other.

The invention claimed is:

1. A nonvolatile semiconductor memory device comprising:
    a semiconductor member;
    a tunnel insulating layer provided on a surface of the semiconductor member;
    a charge storage layer provided on the tunnel insulating layer;
    a charge block layer provided on the charge storage layer;
    a plurality of control gate electrodes provided above the charge block layer and arranged so as to be spaced from each other; and
    a cap layer provided between the charge block layer and each of the control gate electrodes and made of silicon nitride,
    the cap layer being divided for each of the control gate electrodes.

2. The device according to claim 1, wherein the silicon nitride forming the cap layer has a composition such that a ratio of nitrogen element concentration to silicon element concentration is in a range from 120% to 150%.

3. The device according to claim 1, wherein a width of the control gate electrode and a width between the control gate electrodes in an arranging direction of the control gate electrodes are each 100 nm or less.

4. The device according to claim 1, wherein
    the charge block layer is formed from a metal oxide having a higher relative dielectric constant than silicon nitride, and
    the control gate electrode is formed from a metal, metal silicide, or dopant-containing silicon.

5. The device according to claim 4, wherein the metal oxide is alumina, zirconia, hafnia, or tantalum oxide, or a mixture thereof.

6. The device according to claim 1, wherein
    the charge block layer is formed from one of silicon oxide and silicon oxynitride, and
    the control gate electrode is formed from one of a metal and metal silicide.

7. The device according to claim 1, wherein the semiconductor member is a silicon substrate.

8. The device according to claim 7, further comprising:
    an interelectrode insulating film provided between the control gate electrodes; and
    an impurity diffusion region formed immediately below the interelectrode insulating film in an upper portion of the silicon substrate and having a conductivity type different from the conductivity type of the silicon substrate.

9. The device according to claim 1, further comprising:
    a substrate; and
    an interelectrode insulating film provided between the control gate electrodes,
    the control gate electrodes and the interelectrode insulating films being alternately stacked on the substrate to form a multilayer structure body,
    the charge block layer, the charge storage layer, and the tunnel insulating layer being formed on an inner surface of a trench formed in the multilayer structure body, and
    the semiconductor member being a semiconductor pillar buried in the trench.

10. The device according to claim 9, wherein
    the trench is shaped like a cylinder extending in the stacking direction of the control gate electrodes and the interelectrode insulating films, and
    the semiconductor pillar is also shaped like a cylinder extending in a stacking direction.

11. The device according to claim 9, wherein
    the trench is shaped like a stripe extending in one direction, and
    the semiconductor pillar has a U-shape extending along one side surface of the trench, a bottom surface of the trench, and the other side surface of the trench.

12. The device according to claim 9, wherein
    the charge block layer is formed from a metal oxide having a higher relative dielectric constant than silicon nitride, and
    the control gate electrode is formed from a metal, metal silicide, or dopant-containing silicon.

13. The device according to claim 9, wherein the charge block layer is formed from one of silicon oxide and silicon oxynitride, and the control gate electrode is formed from one of a metal and metal silicide.

* * * * *